(12) United States Patent
Yoon et al.

(10) Patent No.: US 8,154,065 B2
(45) Date of Patent: Apr. 10, 2012

(54) SEMICONDUCTOR MEMORY DEVICES INCLUDING A VERTICAL CHANNEL TRANSISTOR HAVING A BURIED BIT LINE

(75) Inventors: Jae-man Yoon, Seoul (KR); Dong-gun Park, Gyeonggi-do (KR); Choong-ho Lee, Gyeonggi-do (KR); Moon-suk Yi, Gyeonggi-do (KR); Chul Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 204 days.

(21) Appl. No.: 12/418,879

(22) Filed: Apr. 6, 2009

(65) Prior Publication Data

US 2009/0189217 A1 Jul. 30, 2009

Related U.S. Application Data

(62) Division of application No. 11/151,673, filed on Jun. 13, 2005, now Pat. No. 7,531,412.

(30) Foreign Application Priority Data

Nov. 8, 2004 (KR) .................. 10-2004-0090496

(51) Int. Cl.
*H01L 27/108* (2006.01)
(52) U.S. Cl. .......... 257/308; 257/E27.088; 257/E27.091
(58) Field of Classification Search .................. 257/288, 257/296, 302, 327–334, 306–309, E27.084–E27.089, 257/E27.091
See application file for complete search history.

(56) References Cited

U.S. PATENT DOCUMENTS

| | | | | |
|---|---|---|---|---|
| 5,828,094 A | 10/1998 | Lee | ............................... | 257/296 |
| 5,885,864 A * | 3/1999 | Ma | ............................... | 438/253 |
| 5,990,509 A | 11/1999 | Burns et al. | ................. | 257/296 |
| 6,114,725 A * | 9/2000 | Furukawa et al. | ............ | 257/330 |
| 6,172,391 B1 * | 1/2001 | Goebel et al. | ................. | 257/305 |
| 6,229,169 B1 | 5/2001 | Hofmann et al. | ............... | 257/296 |
| 6,881,994 B2 * | 4/2005 | Lee et al. | ....................... | 257/296 |
| 7,285,812 B2 | 10/2007 | Tang et al. | .................... | 257/296 |
| 2003/0001290 A1 | 1/2003 | Nitayama et al. | ............. | 257/907 |
| 2007/0145464 A1 | 6/2007 | Voshell et al. | ................ | 257/314 |

FOREIGN PATENT DOCUMENTS

| | | |
|---|---|---|
| KR | 100147584 | 5/1998 |
| KR | P1999-023992 | 3/1999 |

OTHER PUBLICATIONS

Lee, J.Y., et al.; Simultaneously Formed Storage Node Contact and Metal Contact Cell (SSMC) for 1Gb and Beyond; International Electron Devices Meeting, 1996. IEDM,96; pp. 593-596.*

* cited by examiner

*Primary Examiner* — Marcos D. Pizarro
(74) *Attorney, Agent, or Firm* — Myers Bigel Sibley & Sajovec

(57) ABSTRACT

Semiconductor memory devices include a semiconductor substrate and a plurality of semiconductor material pillars in a spaced relationship on the semiconductor substrate. Respective surrounding gate electrodes surround ones of the pillars. A first source/drain region is in the semiconductor substrate between adjacent ones of the pillars and a second source/drain region is in an upper portion of at least one of the adjacent pillars. A buried bit line is in the first source/drain region and electrically coupled to the first source/drain region and a storage node electrode is on the upper portion of the at least one of the adjacent pillars and electrically contacting with the second source/drain region.

11 Claims, 29 Drawing Sheets

FIG. 4D
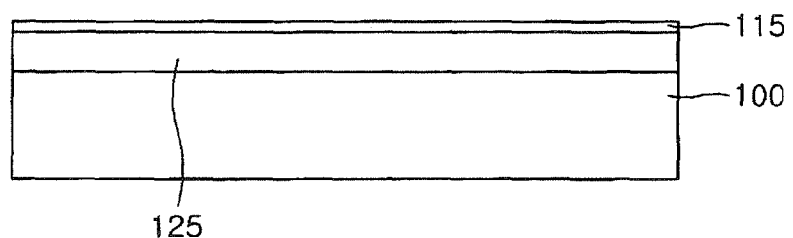
FIG. 4E
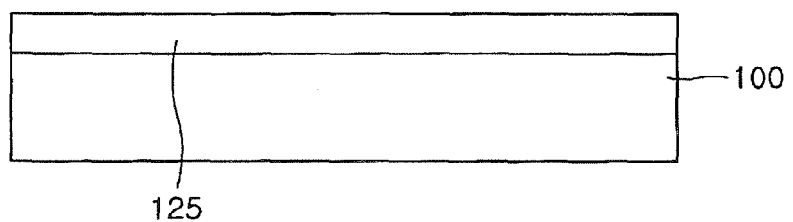
FIG. 4F
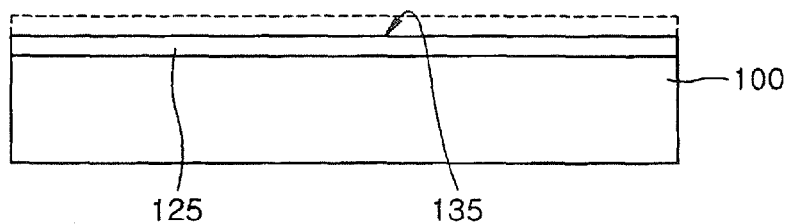

SEMICONDUCTOR MEMORY DEVICES INCLUDING A VERTICAL CHANNEL TRANSISTOR HAVING A BURIED BIT LINE

CROSS-REFERENCE TO RELATED APPLICATION

This application is a divisional of U.S. application Ser. No. 11/151,673, filed Jun. 13, 2005 now U.S. Pat. No. 7,531,412 which claims priority from Korean Patent Application No. 10-2004-0090496 filed on Nov. 8, 2004, the disclosures of which are hereby incorporated herein by reference in their entireties.

BACKGROUND OF THE INVENTION

The present invention relates to semiconductor devices, and more particularly, to semiconductor devices having a vertical channel transistor and methods of manufacturing the same.

As the integration density of semiconductor (integrated circuit) devices increases, the size of metal-oxide-semiconductor (MOS) transistors, and thus, a channel length, of the devices generally decreases. The decrease in channel length generally enhances the integration density of semiconductor devices but may cause a short channel effect, such as drain induced barrier lowering (DIBL), hot carrier effect, and/or punch through. To prevent such a short channel effect, various techniques have been suggested, such as a decrease of the depth of a junction region and an increase of a channel length by formation of groove in a channel region.

However, as the integration density of semiconductor memory devices, in particular, dynamic random access memory (DRAM) devices, currently may be as high as a gigabit, smaller-sized MOS transistors are generally desired. In particular, MOS transistors of gigabit DRAM devices generally require a device area of $8F^2$ (where "F" is a minimum feature size of the device) or less. However, with currently available planar MOS transistors, in which junction regions are typically formed on both sides of a gate electrode formed on a semiconductor substrate, it is generally difficult to obtain a device area of $8F^2$ or less even when a channel length of the device is scaled.

SUMMARY OF THE INVENTION

Embodiments of the present invention provide semiconductor memory devices including a semiconductor substrate and a plurality of semiconductor material pillars in a spaced relationship on the semiconductor substrate. Respective surrounding gate electrodes surround ones of the pillars. A first source/drain region is in the semiconductor substrate between adjacent ones of the pillars and a second source/drain region is in an upper portion of at least one of the adjacent pillars. A buried bit line is in the first source/drain region and electrically coupled to the first source/drain region and a storage node electrode is on the upper portion of the at least one of the adjacent pillars and electrically contacting with the second source/drain region.

In other embodiments of the present invention, semiconductor memory devices include a semiconductor substrate including a plurality of pillars separated from each other by a predetermined distance. A device isolation film is between the pillars. Respective surrounding gate electrodes electrically insulated from the pillars surround an upper outside of each pillar. First source/drain regions are formed in an upper portion of respective ones of the pillar and a second source/drain region is formed in the semiconductor substrate between adjacent ones of the pillars. A buried bit line, interposed between the second source/drain region and the device isolation film, electrically contacts the second source/drain region. A word line is formed in a cross-wise pattern with the bit line and electrically connected to ones of the surrounding gate electrodes. Contact pads, formed on respective ones of the first source/drain regions, contact the respective ones of the first source/drain regions and storage node electrodes are formed on the contact pads.

In yet other embodiments of the present invention, semiconductor memory devices including a semiconductor substrate and a plurality of semiconductor material pillars in a spaced relationship on the semiconductor substrate. A surrounding gate electrode surrounds an outer surface of ones of the pillars and a first source/drain region is in the semiconductor substrate between adjacent ones of the pillars. A second source/drain region is in an upper portion of the ones of the pillars. A buried bit line in the first source/drain region is electrically coupled to the first source/drain region and a storage node electrode on the upper portion of the ones of the pillars electrically contacts the second source/drain region.

In further embodiments of the present invention, semiconductor memory devices include a word line contacting the surrounding gate electrode and extending in a cross-wise pattern relative to the bit line. A conductive spacer may be included between the surrounding gate electrode and the word line. The conductive spacer may be on an upper outside surface of the surrounding gate electrode. A conductive film for the conductive spacer and the word line may include a transition metal film of tungsten (W), cobalt (Co), nickel (Ni), and/or titanium (Ti); a transition metal silicide film of tungsten silicide ($WSi_x$), cobalt silicide ($CoSi_x$), nickel silicide ($NiSi_x$), and/or titanium silicide ($TiSi_x$); and/or a tungsten nitride film (WN)/tungsten film (W).

In further embodiments of the present invention, the first and second source/drain regions are electrically insulated from the surrounding gate electrode. A dielectric material may be located between adjacent ones of the pillars to electrically insulate the adjacent ones of the pillars. The bit line may be a transition metal silicide film.

In other embodiments of the present invention, the plurality of pillars are formed in a matrix and are separated from each other by a predetermined distance. The first source/drain region is a drain region of a vertical channel transistor and the second source/drain region is a source region of the vertical channel transistor.

In yet further embodiments of the present invention, semiconductor memory devices include a semiconductor substrate including a plurality of pillars separated from each other by a predetermined distance with a device isolation film between the pillars. A surrounding gate electrode is electrically insulated from the pillars and surrounds an upper outside of each pillar. A source region is formed in an upper portion of each pillar surrounded by the surrounding gate electrode. A drain region is formed in the semiconductor substrate between the pillars. A buried bit line, interposed between the drain region and the device isolation film, electrically contacts with the drain region. A word line is formed in a cross-wise pattern with the bit line and electrically connected to the gate electrode. A contact pad, formed on the source region, contacts with the source region and a storage node electrode is formed on the contact pad.

In other embodiments of the present invention, a conductive spacer is positioned between an upper outside of the surrounding gate electrode and the word line. A conductive film for the conductive spacer and the word line may be a material selected from a transition metal film formed of tungsten (W), cobalt (Co), nickel (Ni), and/or titanium (Ti); a transition metal silicide film formed of tungsten silicide ($WSi_x$), cobalt silicide ($CoSi_x$), nickel silicide ($NiSi_x$), and/or titanium silicide ($TiSi_x$); and/or a tungsten nitride film (WN)/tungsten film (W). The bit line may surround a lower outside of each pillar. The bit line may be a transition metal silicide film.

In further embodiments of the present invention, methods of manufacturing a semiconductor memory device include forming a plurality of semiconductor material pillars in a spaced relationship on a semiconductor substrate and forming respective surrounding gate electrodes on ones of the pillars. A first source/drain region is formed in the semiconductor substrate between adjacent ones of the pillars. A bit line is formed in the first source/drain region and electrically coupled to the first source/drain region. A second source/drain region is formed in an upper portion of at least one of the adjacent ones of the pillars.

In yet other embodiments of the present invention, methods of manufacturing a semiconductor memory device include forming a plurality of semiconductor material pillars in a spaced relationship on a semiconductor substrate. A surrounding gate electrode is formed on an outer surface of ones of the pillars. A first source/drain region is formed in the semiconductor substrate between adjacent ones of the pillars. A bit line is formed in the first source/drain region and electrically coupled to the first source/drain region and a second source/drain region is formed in an upper portion of the ones of the pillars.

In further embodiments of the present invention, forming a plurality of semiconductor material pillars includes forming a pad oxide film and a hard mask pattern on the semiconductor substrate, forming a plurality of pillars to a smaller width than the width of the hard mask pattern by etching the pad oxide film and the semiconductor substrate conformally to the hard mask pattern and isolating the pillars by etching the semiconductor substrate between the pillars to a predetermined depth. Forming a bit line may include forming the bit line to surround outer surfaces of the pillars. The methods may further include forming a word line in a cross-wise pattern with the bit line so that the word line is electrically connected to the gate electrode and removing the hard mask pattern. Forming a second source/drain region may include forming the second source/drain region in the upper portion of the ones of the pillars after removing the hard mask pattern to expose the upper portion.

In yet further embodiments of the present invention, forming a plurality of pillars includes etching the pad oxide film and the semiconductor substrate to a predetermined depth using the hard mask pattern and etching sidewalls of the semiconductor substrate to a predetermined width. Isolating the pillars by etching the semiconductor substrate to a predetermined depth may include anisotropically etching the semiconductor substrate to a depth of about 500 Å to about 1,500 Å. Etching sidewalls of the semiconductor substrate may include anisotropically etching the sidewalls to a width of about 200 Å to about 300 Å using the hard mask pattern as an etching mask. The sidewalls of the semiconductor substrate may be anisotropically etched by plasma wet etching and/or chemical dry etching.

In other embodiments of the present invention, forming the surrounding gate electrode includes forming a gate oxide film on the pillars and surfaces of the semiconductor substrate between the pillars, depositing a conductive film on the gate oxide film and etching back the conductive film so that the conductive film remains on sidewalls of the pillars. Forming the first source/drain region may include ionically implanting an impurity in an exposed portion of the semiconductor substrate between the pillars by the hard mask pattern and the surrounding gate electrode.

In further embodiments of the present invention, forming the bit line in the drain region includes forming a groove in the drain region to a shallower depth than the drain region, forming a dielectric film at sidewalls of the groove, selectively forming a conductive line in the groove and etching a predetermined portion of the conductive line to form the bit line. Forming the groove may include coating a dielectric film on a surface of the semiconductor substrate, etching back the dielectric film so that the dielectric film surrounds an outer surface of the surrounding gate electrode and a predetermined portion of the drain region is exposed and etching the exposed portion of the drain region to a predetermined depth using the etched-back dielectric film as an etching mask.

In yet other embodiments of the present invention, forming the conductive line includes depositing a transition metal film on a surface of the semiconductor substrate including the groove, selectively forming a transition metal silicide film by heating so that the transition metal film reacts with underlying semiconductor substrate material and removing an unreacted portion of the transition metal film. Etching a predetermined portion of the conductive line to form the bit line may include depositing a dielectric film on the semiconductor substrate where the conductive line is formed, forming a dielectric spacer by etching back the dielectric film and etching the conductive line using the dielectric spacer as an etching mask. The dielectric film may be formed to a thickness selected to provide a filled space between adjacent ones of the pillars and/or a space between the pillars as viewed in the x-axis direction.

In further embodiments of the present invention, isolating the pillars includes etching the semiconductor substrate between the pillars to a depth of about 1,000 Å to about 1,500 Å using the bit line as an etching mask. After isolating the pillars and before forming the word line, a conductive spacer may be formed on an upper outside of the surrounding gate electrode to provide conductivity of the surrounding gate electrode. Forming the conductive spacer may include forming on the semiconductor substrate a dielectric film to a substantially same height as the hard mask pattern, removing the dielectric film to a predetermined depth so that sidewalls of the hard mask pattern and upper outsides of the surrounding gate electrode are exposed, depositing a conductive film on the semiconductor substrate including the dielectric film removed to a predetermined depth and etching back the conductive film to form the conductive spacer on the exposed sidewalls of the hard mask pattern and the exposed upper outsides of the surrounding gate electrode. Removing the dielectric film may include removing the dielectric film by a wet etch-back process. The conductive film for the conductive spacer may be a transition metal film formed of tungsten (W), cobalt (Co), nickel (Ni), and/or titanium (Ti); a transition metal silicide film formed of tungsten silicide ($WSi_x$), cobalt silicide ($CoSi_x$), nickel silicide ($NiSi_x$), and/or titanium silicide ($TiSi_x$); and/or a tungsten nitride film (WN)/tungsten film (W). The conductive spacer may be formed to a lower height than the hard mask pattern.

In other embodiments of the present invention, forming the word line includes forming, on the semiconductor substrate including the conductive spacer, a first dielectric film to a substantially same height as the hard mask pattern, forming a second dielectric film on the first dielectric film, forming a photoresist pattern on the second dielectric film in a cross-wise pattern with the bit line so that the hard mask pattern is exposed, etching the first and second dielectric films to a predetermined depth using the photoresist pattern as an etching mask, removing the photoresist pattern, depositing a conductive film on the semiconductor substrate including the etched first and second dielectric films with the photoresist pattern removed and etching back the conductive film to a lower height than the hard mask pattern to form the word line. The first and second dielectric films may be formed of a material having etching selectivity with respect to the hard mask pattern. Etching the first and second dielectric films may include etching the first and second dielectric films to a depth that exposes a portion of the conductive spacer.

In yet further embodiments of the present invention, the conductive film for the word line includes a transition metal film formed of tungsten (W), cobalt (Co), nickel (Ni), and/or titanium (Ti); a transition metal silicide film formed of tungsten silicide ($WSi_x$), cobalt silicide ($CoSi_x$), nickel silicide ($NiSi_x$), and/or titanium silicide ($TiSi_x$); and/or a tungsten nitride film (WN)/tungsten film (W). Etching back the conductive film to form the word line may include initially etching back the conductive film so that the hard mask pattern is exposed and further etching back the conductive film to a lower height than the hard mask pattern. Forming the second source/drain region may include implanting ionic impurities in the pillars on which the hard mask pattern is removed.

In other embodiments of the present invention, after forming the second source/drain region, the methods further include forming a contact pad on the second source/drain region and electrically connected thereto and forming a storage node electrode on the contact pad and electrically connected thereto. The contact pad may be electrically insulated from the conductive spacer and the gate electrode.

In further embodiments of the present invention, methods of manufacturing a semiconductor memory device include forming on a semiconductor substrate a hard mask pattern defining a pad oxide film and an active region, forming a plurality of pillars by etching the pad oxide film to a predetermined depth and the semiconductor substrate to a predetermined width using the hard mask pattern as an etching mask, forming a surrounding gate electrode on an outer surface of ones of the pillars, forming a drain region in the semiconductor substrate between the ones of the pillars, selectively forming a conductive line in the drain region, forming a dielectric spacer surrounding the hard mask pattern, forming a bit line by etching the conductive line using the dielectric spacer as an etching mask, isolating the ones of the pillars by etching the semiconductor substrate using the bit line as an etching mask, forming a conductive spacer on an upper outside of the surrounding gate electrode, forming a word line contacting with the conductive spacer in a crosswise pattern with the bit line, removing the hard mask pattern, forming a source region in the pillars where the hard mask pattern is removed, forming a contact pad on the source region so that the contact pad contacts with the source region and is electrically insulated from the conductive spacer and the gate electrode and forming a storage node electrode on the contact pad. Forming the source region may include depositing a dielectric film on the semiconductor substrate in a region where the hard mask pattern is removed, forming a dielectric spacer at sidewalls of the conductive spacer by anisotropically etching the dielectric film to expose the pad oxide film, etching the pad oxide film using the dielectric spacer as an etching mask and implanting an impurity in exposed portions of the ones of the pillars

BRIEF DESCRIPTION OF THE DRAWINGS

FIGS. 4A through 4M are cross-sectional views taken along lines b-b' of FIGS. 2A through 2D.

DETAILED DESCRIPTION OF THE INVENTION

Figure 1A:
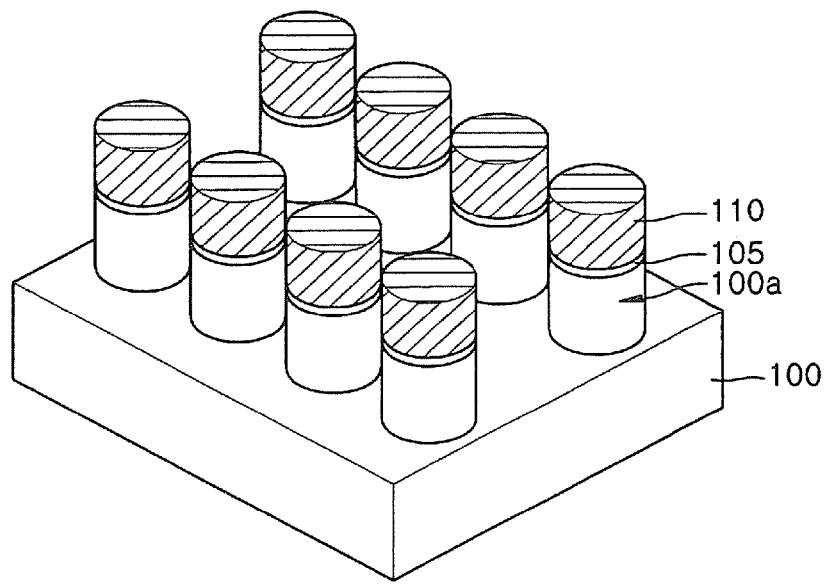
FIGS. 1A through 1H are perspective views illustrating a semiconductor (integrated circuit) memory device according to some embodiments of the present invention.
Figure 1B:
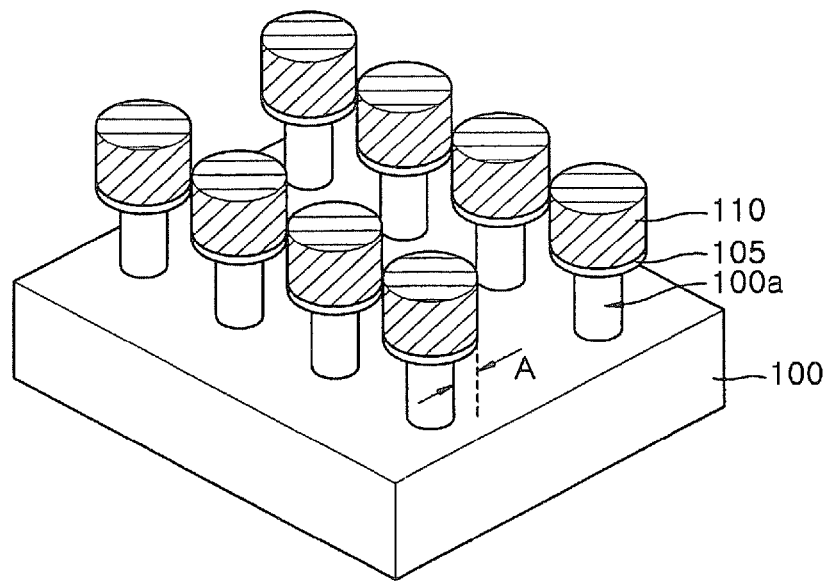
Figure 1C:
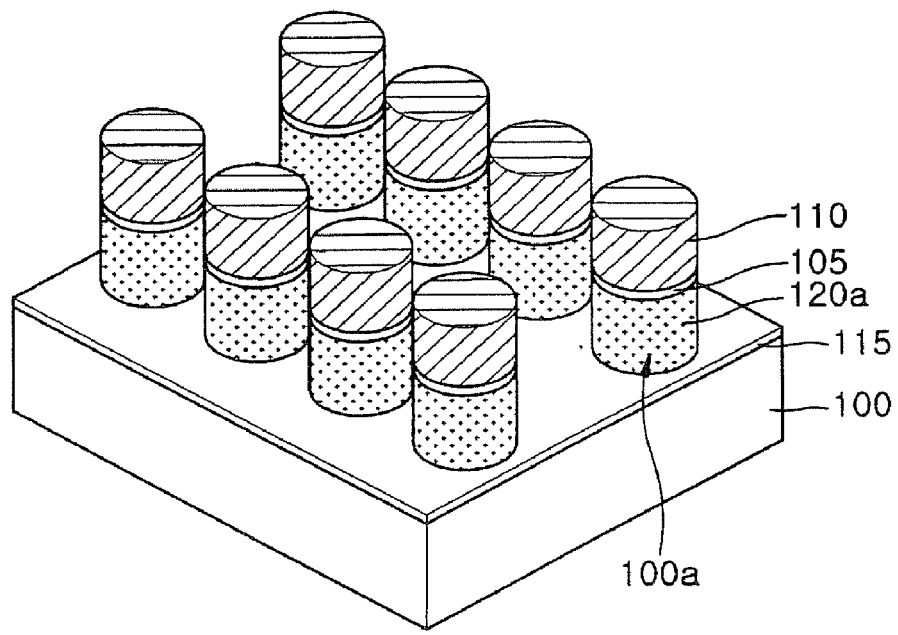
Figure 1D:
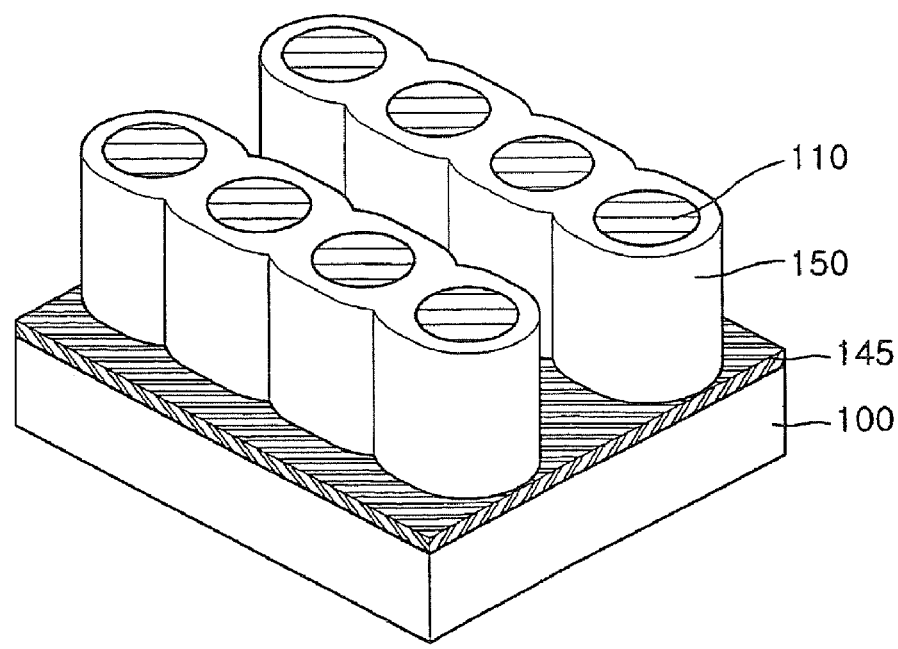
Figure 1E:
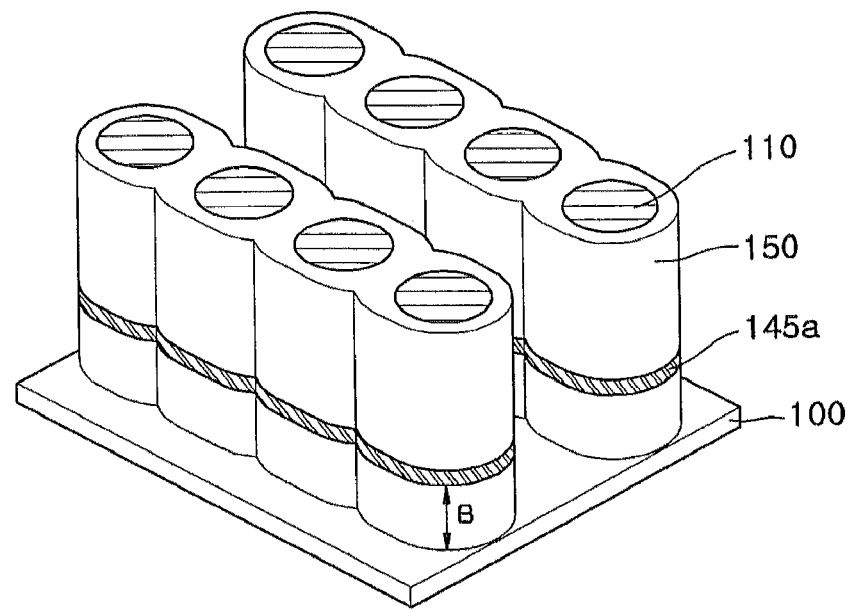
Figure 1F:
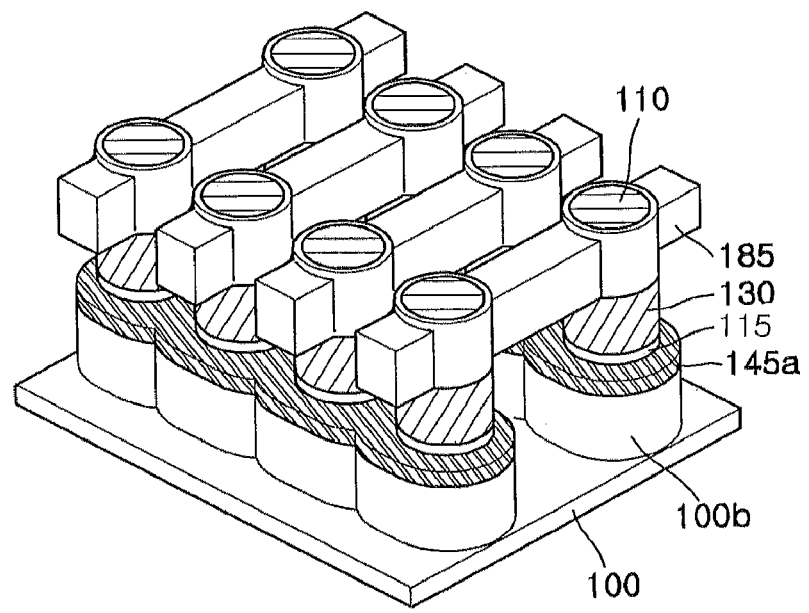
Figure 1G:
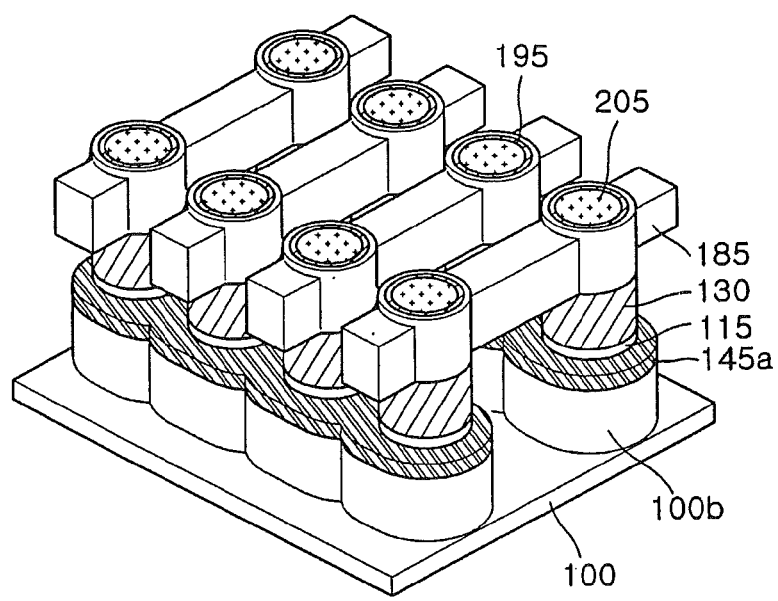

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As will be described herein, some embodiments of the present invention may provide a semiconductor memory device that can be ultra-highly integrated. Other embodiments may provide a simple manufacturing method of a semiconductor memory device that can be ultra-highly integrated.

Various embodiments of the present invention for forming a semiconductor device will now be further described with reference to the figures. Referring first to FIGS. 1A, 2A, 3A, 4A, and 5A, a pad oxide film 105 is formed on a semiconductor (integrated circuit) substrate 100. The pad oxide film 105 may be, for example, a silicon oxide film and may be formed to a thickness of about 50 to 1500 Å by thermal oxidation. A hard mask film is deposited on the pad oxide film 105. The hard mask film may be formed of a material having etching selectivity with respect to the pad oxide film 105 and the semiconductor substrate 100, for example, silicon nitride. To define an active region on the hard mask film, a photoresist pattern (not shown) may be formed on the hard mask film by a conventional method. Hard mask patterns 110 may then be formed by etching the hard mask film using the photoresist pattern as an etching mask.

The length of one side of each hard mask pattern 110 is 1F (where "F" is a minimum feature size of the semiconductor device). Spacing between adjacent ones of the hard mask patterns 110 in the x-axis direction is 0.5F and spacing between adjacent ones of the hard mask patterns 110 in the y-axis direction is 1.5F.

Next, the pad oxide film 105 and the semiconductor substrate 100 are shown as etched to a predetermined depth using the hard mask patterns 110 as etching masks. The semiconductor substrate 100, in some embodiments, is etched to a depth of about 800 to 1,500 Å. As particularly shown in FIG. 4A, a region represented by a dotted line illustrates a surface of the semiconductor substrate 100 before the etching. Through the etching of the semiconductor substrate 100, pillars 100a are formed as active regions in the semiconductor substrate 100. The hard mask patterns 110 may initially be square-shaped as shown in the plan view of FIG. 2A but may subsequently obtain a substantially cylindrical structure as shown in FIG. 1A as the etching process proceeds.

Referring now to the embodiments of FIGS. 1B, 3B, 4A, and 5B, the semiconductor substrate 100, in particular, sidewalls of the pillars 100a of the semiconductor substrate 100 are, for example, anisotropically etched to a predetermined width A using the hard mask patterns 140 as etching masks. For example, the pillars 100a may be etched by plasma wet etching and/or chemical dry etching. A distance A between a sidewall of each of the pillars 100a and the same side sidewall of corresponding one of the hard mask patterns 110 may correspond to a thickness intended for a gate electrode, for example 200 to 300 Å.

Figure 3A:
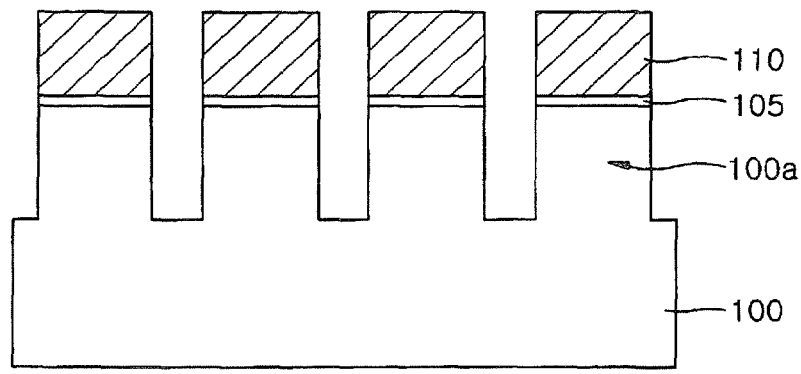
FIGS. 3A through 3O are cross-sectional views taken along lines a-a' of FIGS. 2A through 2D.
Figure 3B:
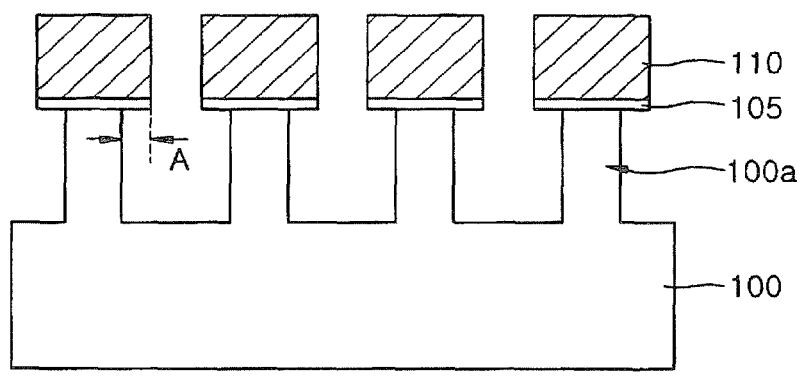
Figure 3C:
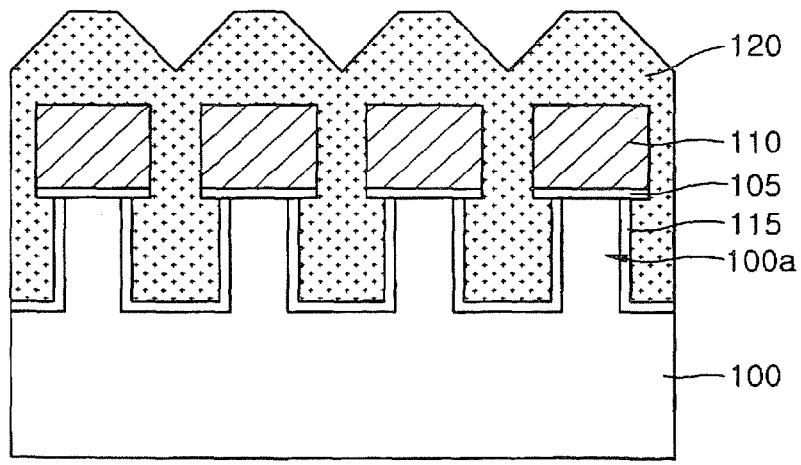
Figure 3D:
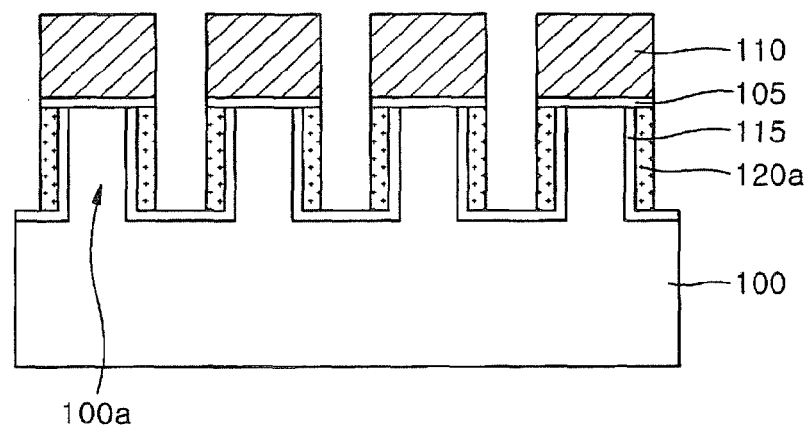
Figure 4A:
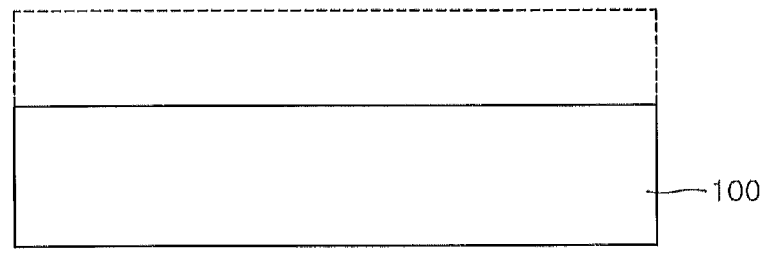
Figure 4B:
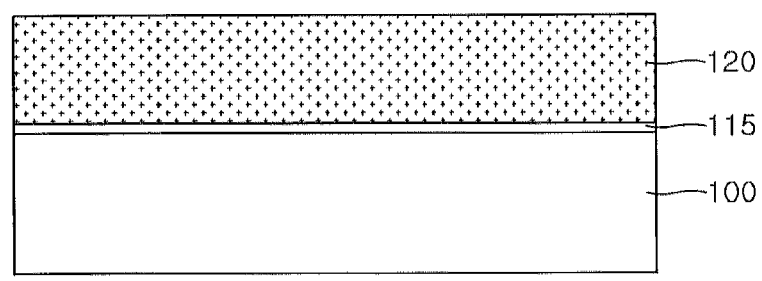
Figure 4C:
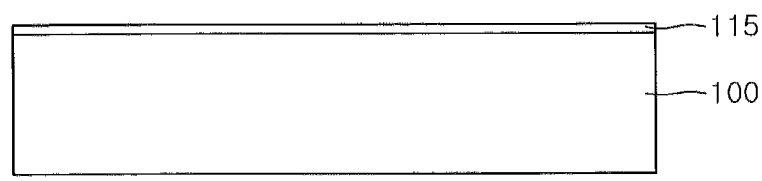
Figure 5A:
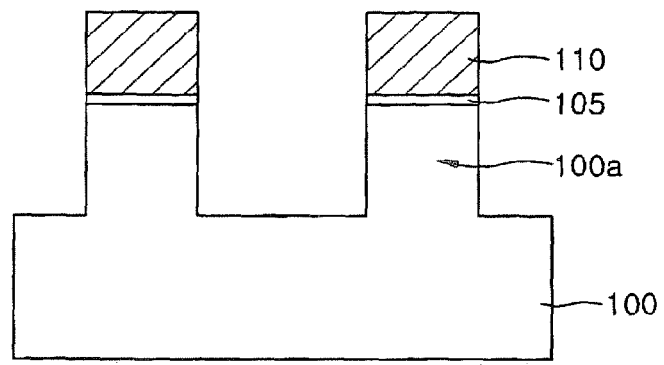
FIGS. 5A through 5P are cross-sectional views taken along lines c-c' of FIGS. 2A through 2D.
Figure 5B:
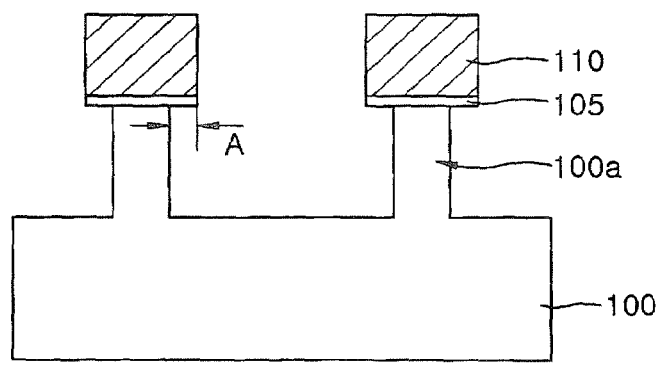
Figure 5C:
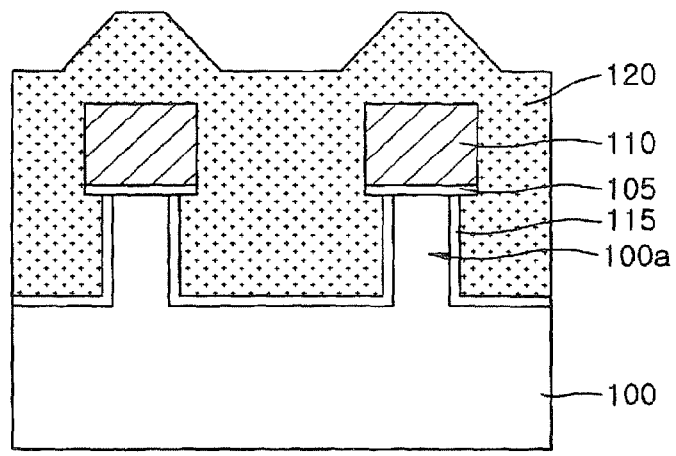
Figure 5D:
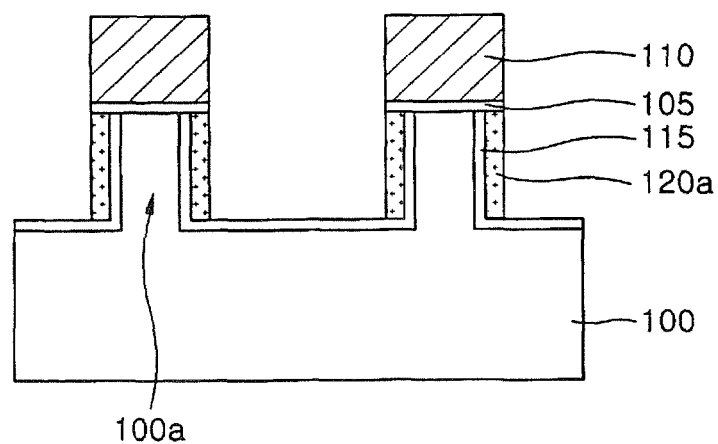

Referring next to FIGS. 3C, 4B, and 5C, a first dielectric film 115 is formed on exposed portions of the semiconductor substrate 100, in particular, on surfaces of the pillars 100a and surfaces of the semiconductor substrate 100 between the pillars 100a. The first dielectric film 115 may be, for example, a gate dielectric film formed of silicon oxide ($SiO_2$), hafnium oxide ($HfO_2$), tantalum oxide ($Ta_2O_5$), and/or ONO (oxide/nitride/oxide). The first dielectric film 115 may be formed by oxidation of the semiconductor substrate 100 and/or deposition.

A first conductive film 120 is shown deposited on the resultant semiconductor substrate structure. The first conductive film 120 may be formed of a gate electrode material. The first conductive film 120 may be, for example, a polysilicon film doped with an n- or p-type impurity and/or a silicon germanium film.

Referring now to FIGS. 1C, 3D, 4C, and 5D, the first conductive film 120 is shown etched back using the first dielectric film 115, i.e., the gate dielectric film, as an etch stop film, thereby resulting in formation of surrounding gate electrodes 120a surrounding the pillars 100a. In some embodiments, the surrounding gate electrodes 120a are formed in spaces defined between the pillars 100a and the hard mask patterns 110 and have a vertical sectional shape with respect to the surface of the semiconductor substrate 100.

Figure 3E:
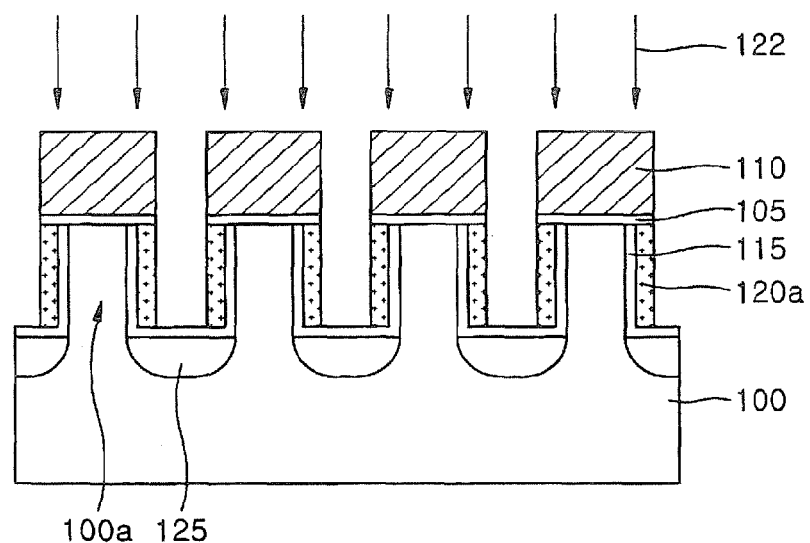
Figure 5E:
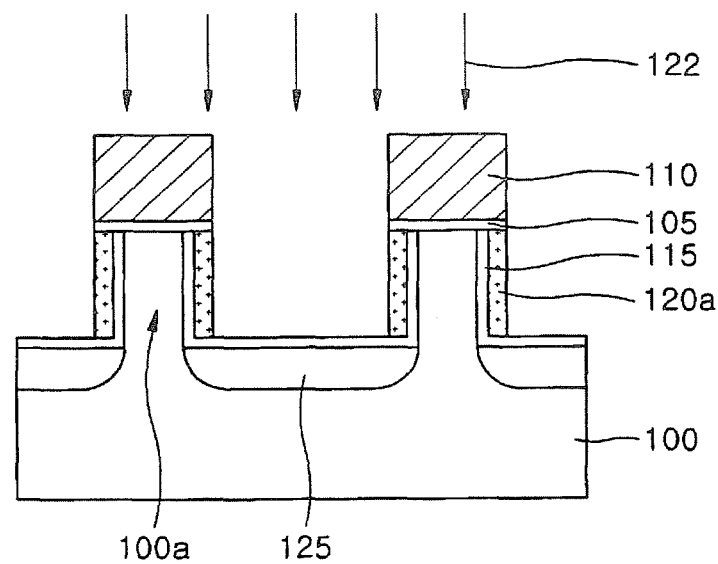

As seen in the embodiments of FIGS. 3E, 4D, and 5E, lower drain (and/or source) regions 125 are formed in the semiconductor substrate 100 between the pillars 100a by, for example, ion implantation of an impurity 122, such as phosphorus (P) and/or arsenic (As).

Figure 3F:
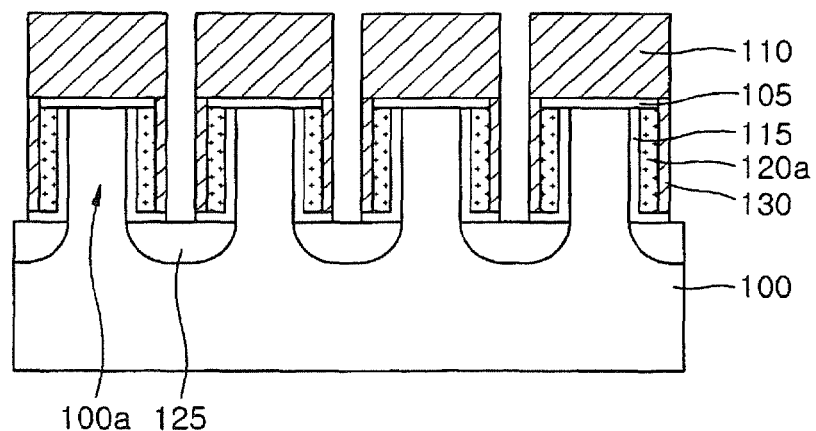
Figure 5F:
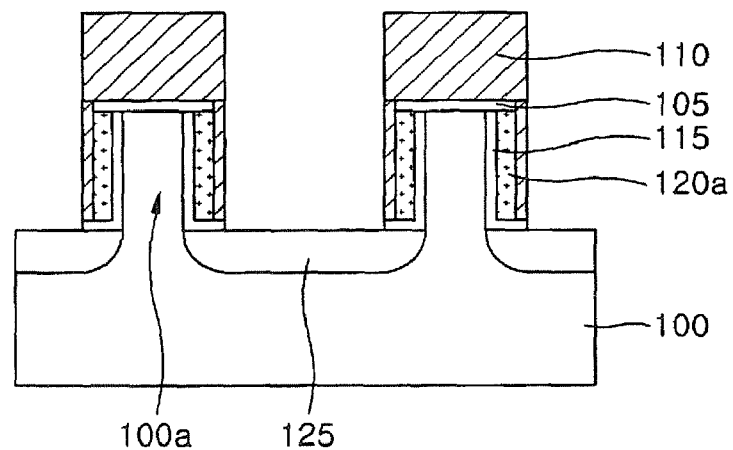

Referring now to the embodiments of FIGS. 3F, 4E, and 5F, a second dielectric film 130 is deposited to a thickness, for example, of 100 to 200 Å, on the resultant semiconductor substrate structure. The second dielectric film 130 may be a film having etching selectivity with respect to the semiconductor substrate 100, for example, a silicon nitride film. The second dielectric film 130 is etched back so that it remains on surfaces of the surrounding gate electrodes 120a. As a result, the surrounding gate electrodes 120a may be isolated by the pad oxide film 105, the first dielectric film 115 (gate dielectric film), and the second dielectric film 130. Subsequently, an exposed portion of the first dielectric film 115 (gate dielectric film) on the drain regions 125 may be removed, for example, using the second dielectric film 130 as an etching mask.

Figure 3G:
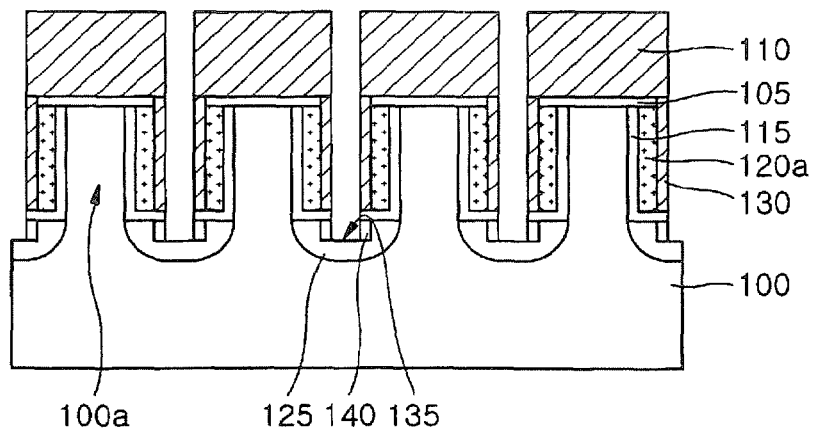
Figure 5G:
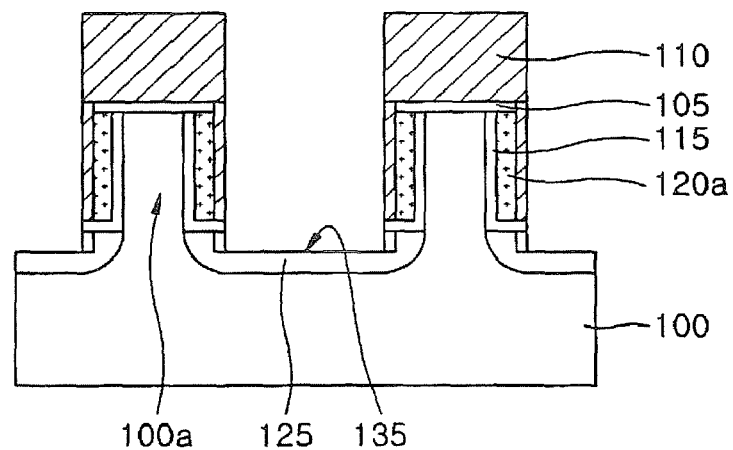

As shown in the embodiments of FIGS. 3G, 4F, and 5G, exposed portions of the lower drain regions 125 are, for example, anisotropically etched to a predetermined depth using the second dielectric film 130 remaining on the surfaces (sidewall surfaces) of the surrounding gate electrodes 120a as etching masks to form grooves 135. At this time, the grooves 135 in some embodiments have a shallower depth than the lower drain regions 125. The grooves 135 may be regions intended to be occupied by bit lines. A third dielectric film 140 is shown formed on exposed surfaces of the semiconductor substrate 100, in other words, on surfaces of the grooves 135. The third dielectric film 140 may be a silicon oxide film and/or a silicon nitride film and may be formed to a thickness of about 50 to 100 Å. In some embodiments, the third dielectric film 140 is formed on surfaces of the grooves 135 by surface oxidation of the grooves 135.

The third dielectric film 140 is etched back so that it remains only on sidewalls of the grooves 135. At this time, the third dielectric film 140 disposed on the sidewalls of the grooves 135 may serve to electrically insulate the surrounding gate electrodes 120a and bit lines to be formed in the grooves 135.

Figure 3H:
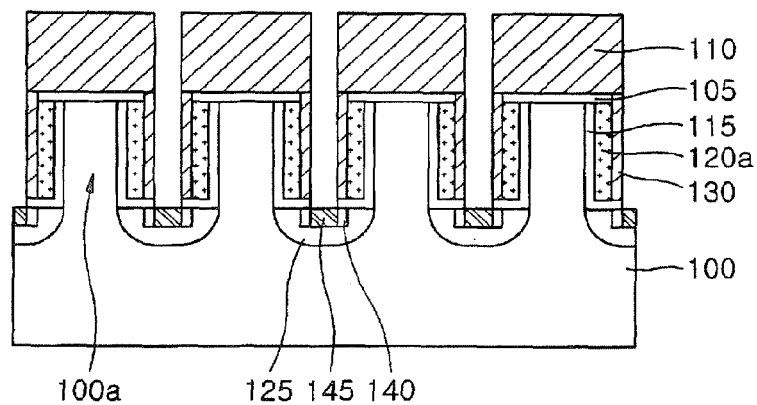
Figure 3I:
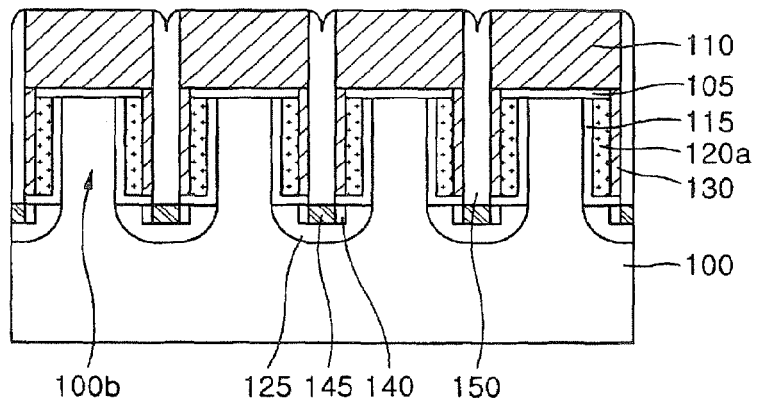
Figure 4G:
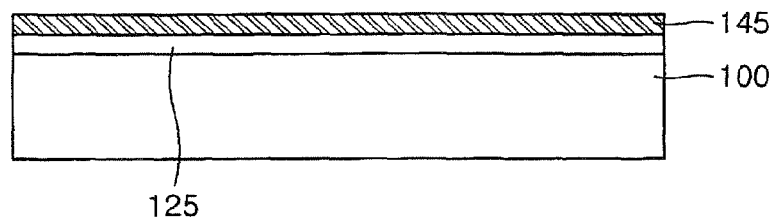
Figure 5H:
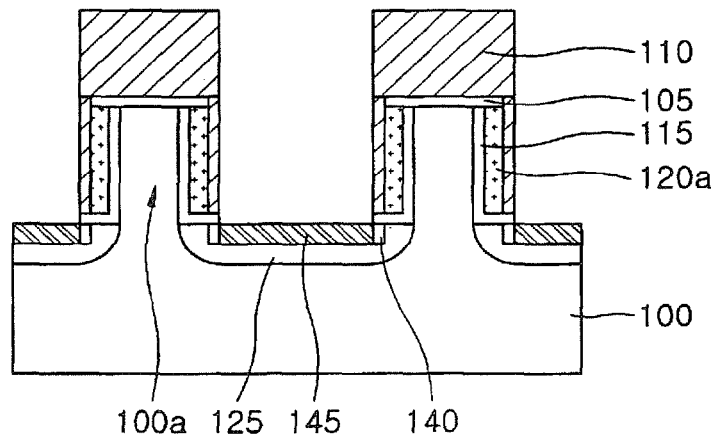
Figure 5I:
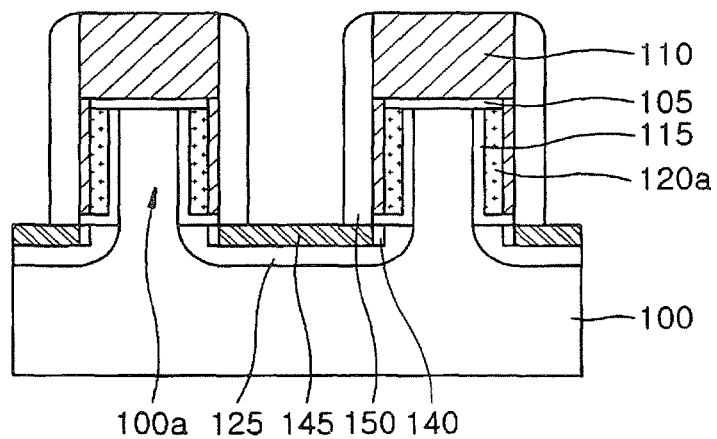
Figure 5J:
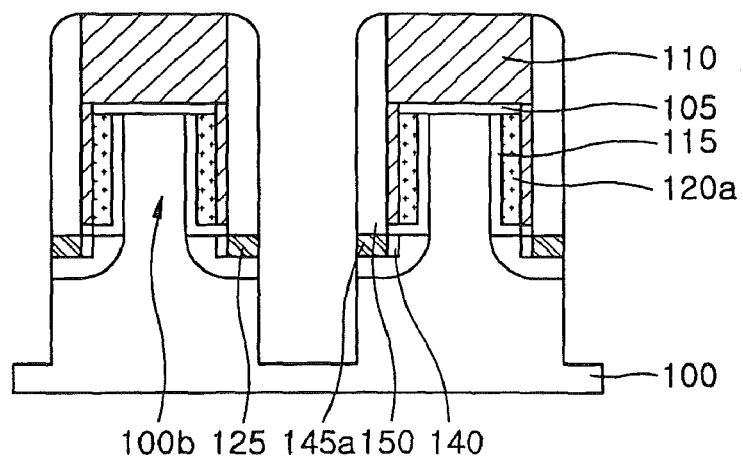

Referring now to FIGS. 3H, 4G, and 5H, silicide films 145 are formed on exposed portions of the semiconductor substrate 100. For example, the silicide films 145 may be formed by depositing a second conductive film on the semiconductor substrate structure and then thermally treating the resultant semiconductor structure to cause a reaction between the second conductive film and a silicon material of the semiconductor substrate 100. The second conductive film may be a film formed of a transition metal, such as cobalt (Co), titanium (Ti), nickel (Ni), and/or tungsten (W) and may have a thickness of 100 to 300 Å. As a result, the silicide films 145 may be formed on exposed portions of the semiconductor substrate 100 by direct contact reaction of the second conductive film with the semiconductor substrate 100. In other words, the silicide films 145 may be selectively formed only on exposed portions of the semiconductor substrate 100, in particular, only in the grooves 135 in the drain regions 125.

During this processing, portions of the second conductive film formed on dielectric films may remain unreacted in the form of a transition metal film even when thermally treated. The second conductive film remaining unreacted may then be removed by a conventional method to result in the illustrated structure of FIGS. 3H, 4G, and 5H. As the silicide films 145 are formed in the grooves 135 of the drain regions 125, they may be electrically connected to the drain regions 125 but insulated from the surrounding gate electrodes 120a.

As illustrated in the embodiments of FIGS. 1D, 3I, 4G, and 5I, a fourth dielectric film 150 is deposited on the resultant semiconductor substrate structure on which the silicide films 145 are formed. For example, the fourth dielectric film 150 may be a silicon oxide film and/or a silicon nitride film. In some embodiments, the fourth dielectric film 150 is formed to a thickness sufficient to fill spaces between the pillars 100a arrayed along the line a-a' (X-axis direction) of FIG. 2A, in other words, spaces between adjacent ones of the pillars 100a. The fourth dielectric film 150 may then be etched back. As a result, the fourth dielectric film 150 may be formed as a spacer surrounding the hard mask patterns 110 and the surrounding gate electrodes 120a and may be absent in spaces between the pillars 100a in the y-axis direction. Thus, as shown in FIGS. 1D, 3I, 4G, and 5I, the fourth dielectric film 150 of a spacer form fills spaces between the pillars 100a in the x-axis direction.

Figure 3J:
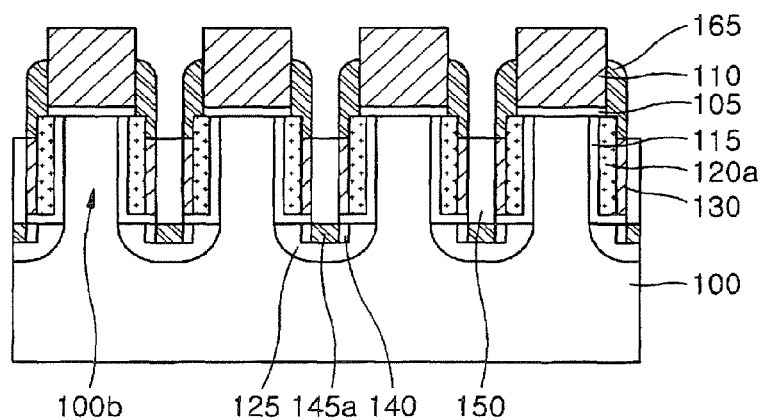
Figure 3K:
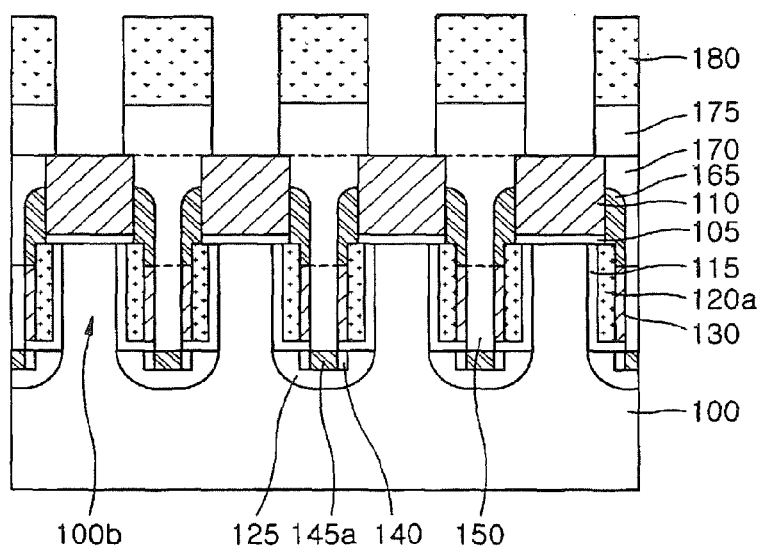
Figure 3L:
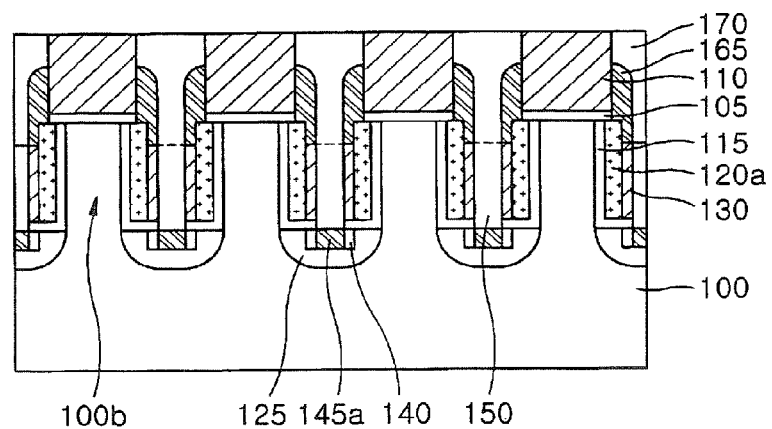
Figure 4H:
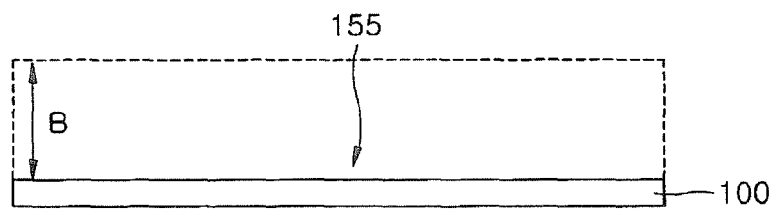

Next, referring to the embodiments of FIGS. 1E, 2B, 3J, 4H, and 5J, exposed portions of the silicide films 145 are etched using the fourth dielectric film 150 as an etching mask to define bit lines 145a. The bit lines 145a are formed to surround the pillars 100a as shown in the illustrated embodiments and extend along the x-axis direction as viewed in a plan view. The bit lines 145a may be electrically insulated from the surrounding gate electrodes 120a by the third dielectric film 140. For these illustrated embodiments, the bit lines 145a may be formed in a self-aligned manner without requiring a separate mask pattern. Then, an exposed portion of the semiconductor substrate 100 is etched to a predetermined depth B (FIG. 1E, 4H), for example, 1,000 to 1,500 Å, using the bit lines 145a as etching masks, to form trenches 155 (FIG. 4H). Adjacent ones of the pillars 100a may be isolated by the trenches 155. The pillars 100a after being isolated are indicated by a reference numeral 100b in the figures.

Figure 4I:
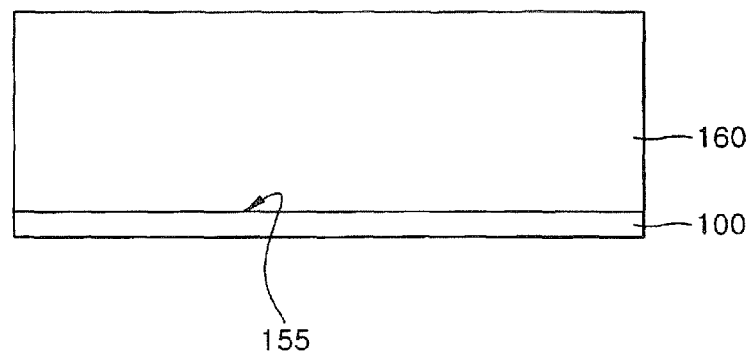
Figure 4J:
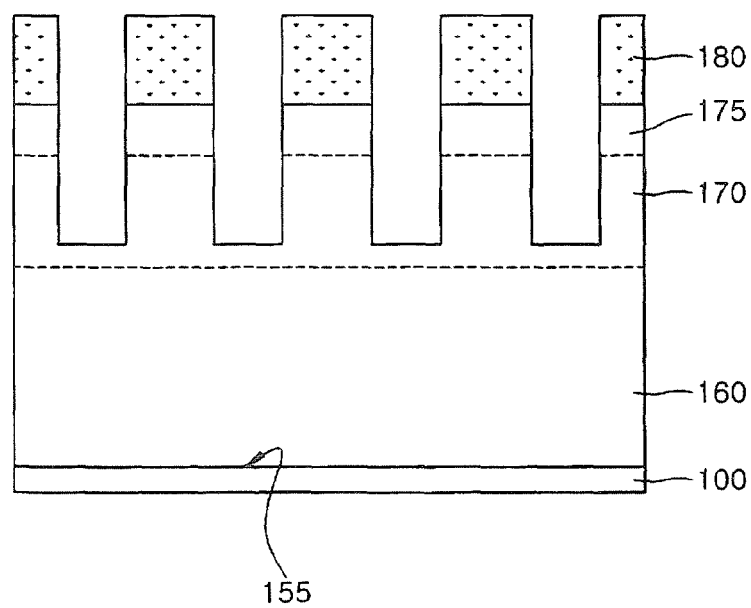
Figure 4K:
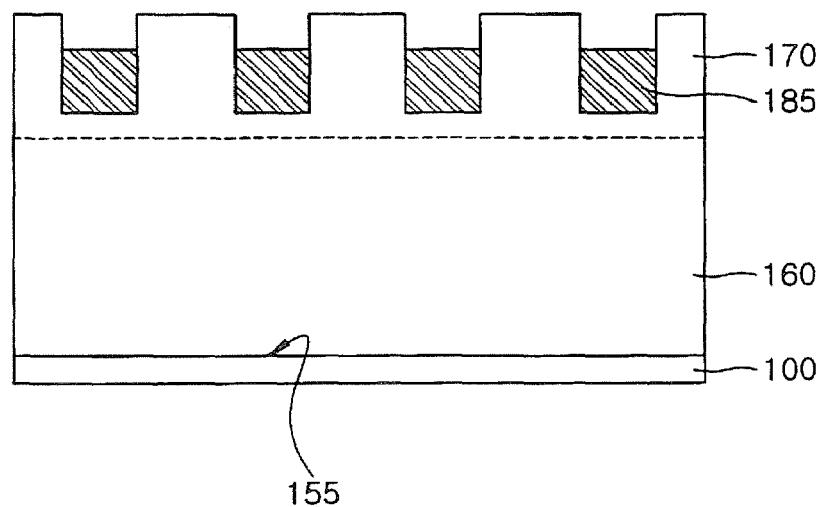
Figure 5K:
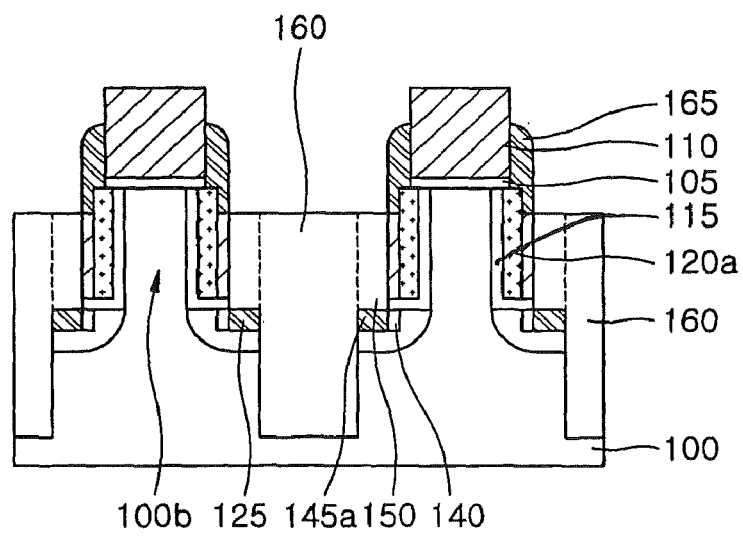
Figure 5L:
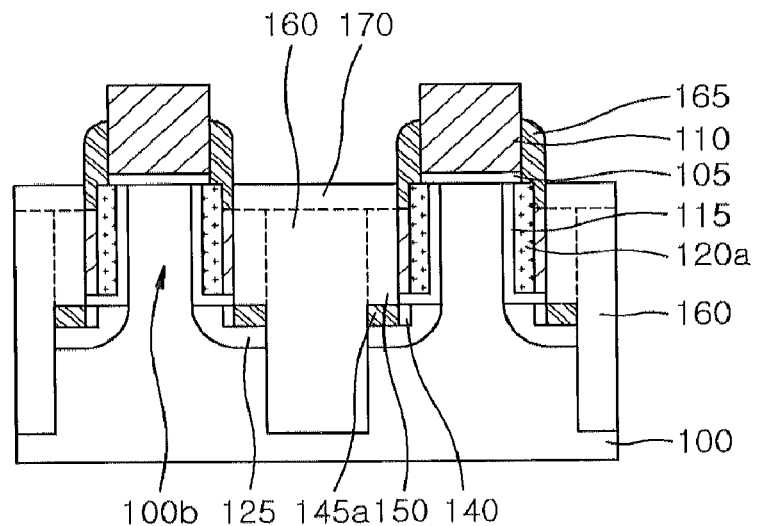
Figure 5M:
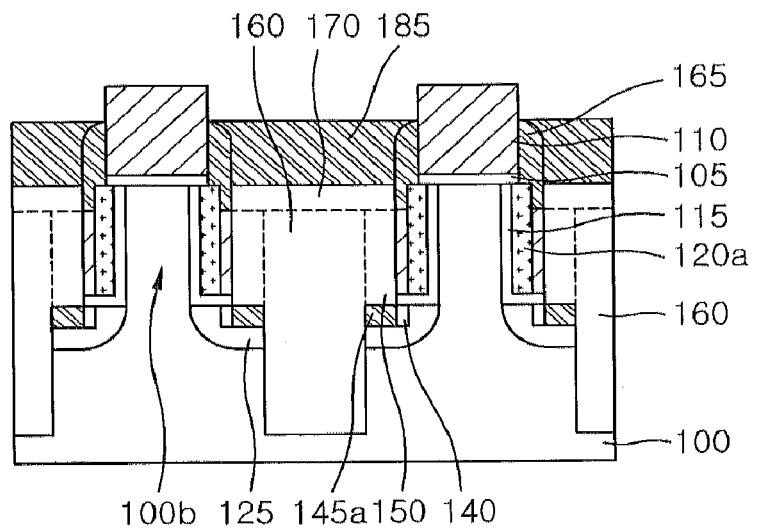

Referring now to the embodiments of FIGS. 3J, 4I, and 5K, a fifth dielectric film 160, for example, a silicon oxide film, is deposited on the resultant semiconductor substrate structure so that the trenches 155 are sufficiently filled. The fifth dielectric film 160 may be planarized so that the hard mask patterns 110 are exposed. This planarization may be performed by, for example, a chemical mechanical polishing process and/or an etch-back process. In some embodiments, the fifth dielectric film 160 is formed in when the fourth dielectric film 150 is formed. However, the fourth dielectric film 150 may also be removed prior to the formation of the fifth dielectric film 160 in other embodiments.

The fifth dielectric film 160 and the fourth dielectric film 150 are subjected to, for example, a wet etch-back process, to a predetermined depth. The fifth dielectric film 160 and the fourth dielectric film 150 may be etched back to a lower height than the hard mask patterns 110 (FIG. 5K). An exposed portion of the second dielectric film 130 covering the surrounding gate electrodes 120a is removed. As a result, upper outside surfaces of the surrounding gate electrodes 120a may be exposed.

Next, third conductive spacers 165 are formed. The third conductive spacers 165 may be formed by depositing a third conductive film on the resultant semiconductor substrate structure. The third conductive film may be a transition metal film formed of tungsten (W), cobalt (Co), nickel (Ni), and/or titanium (Ti); a transition metal silicide film formed of tungsten silicide ($WSi_x$), cobalt silicide ($CoSi_x$), nickel silicide ($NiSi_x$), and/or titanium silicide ($TiSi_x$); and/or a tungsten nitride film (WN)/tungsten film (W). Then, the third conductive film may be etched back so that surfaces of the hard mask patterns 110 are exposed, to thereby form the conductive spacers 165. The conductive spacers 165 contact with upper outside surfaces of the surrounding gate electrodes 120a to enhance conductivity of the surrounding gate electrodes 120a, which may be formed of polysilicon. At this time, the conductive spacers 165 in some embodiments are excessively etched back to a lower height than the hard mask patterns 110.

Referring next to the embodiments of FIGS. 2C, 3K, 4J, and 5L, a sixth dielectric film 170 is deposited on the resultant semiconductor substrate structure on which the conductive spacers 165 are formed, so that spaces between the hard mask patterns 110 are sufficiently filled. The sixth dielectric film 170 may be a silicon oxide film, like the fifth dielectric film 160. The sixth dielectric film 170 may be planarized so that surfaces of the hard mask patterns 110 are exposed. The planarization may be performed, for example, by a chemical mechanical polishing process and/or an etch-back process.

A seventh dielectric film 175 is deposited to a thickness of about 200 to 1,000 Å on the planarized sixth dielectric film 170. The seventh dielectric film 175 may also be a silicon oxide film. Then, a photoresist pattern 180 is formed on the seventh dielectric film 175 so that the hard mask patterns 110 and the seventh dielectric film 175 between the hard mask patterns 110a in the y-axis direction (FIG. 2C) are exposed. That is, the photoresist pattern 180 and alternating regions left exposed by the photoresist pattern 180 run in parallel to the y-axis direction. Exposed portions of the seventh and sixth dielectric films 175 and 170 are etched to a predetermined thickness, for example a thickness of 1,000 to 2,000 Å using the photoresist pattern 180 as an etching mask. As a result, predetermined portions of the hard mask patterns 110 and the conductive spacers 165 are exposed.

Referring now to the embodiments of FIGS. 1F, 2D, 3L, 4K, and 5M, the photoresist pattern 180 may be removed by a conventional method. Then, word lines 185 (FIG. 5M) are formed. To form the word lines 185, a fourth conductive film for word lines may be deposited to a thickness of about 1,000 to 2,000 Å on the resultant semiconductor substrate structure so that spaces between the seventh and sixth dielectric films 175 and 170 are sufficiently filled. The fourth conductive film may also be a transition metal film formed of tungsten (W), cobalt (Co), nickel (Ni), and/or titanium (Ti); a transition metal silicide film formed of tungsten silicide ($WSi_x$), cobalt silicide ($CoSi_x$), nickel silicide ($NiSi_x$), and/or titanium silicide ($TiSi_x$); and/or a tungsten nitride film (WN)/tungsten film (W), like the third conductive film. Then, for node isolation of the fourth conductive film, the fourth conductive film and the seventh dielectric film 175 may be etched back so that the hard mask patterns 110 are exposed. Then, the fourth conductive film may be further etched back to a lower height than the sixth dielectric film 170 and the hard mask patterns 110, to thereby form word lines 185.

Figure 2A:
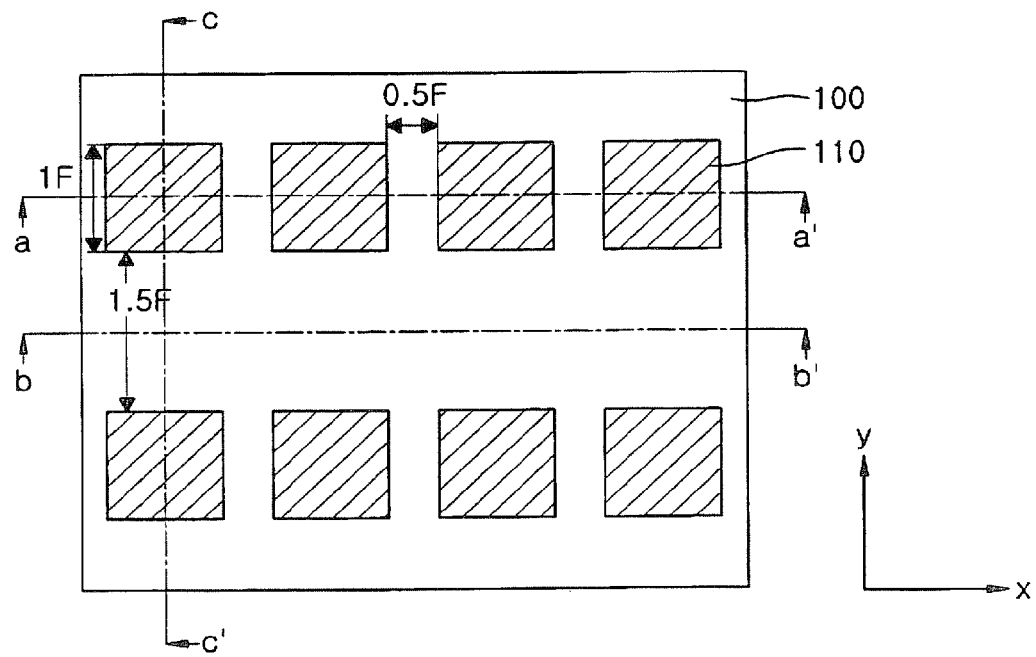
FIGS. 2A through 2D are plan views illustrating a semiconductor memory device according to some embodiments of the present invention.
Figure 2B:
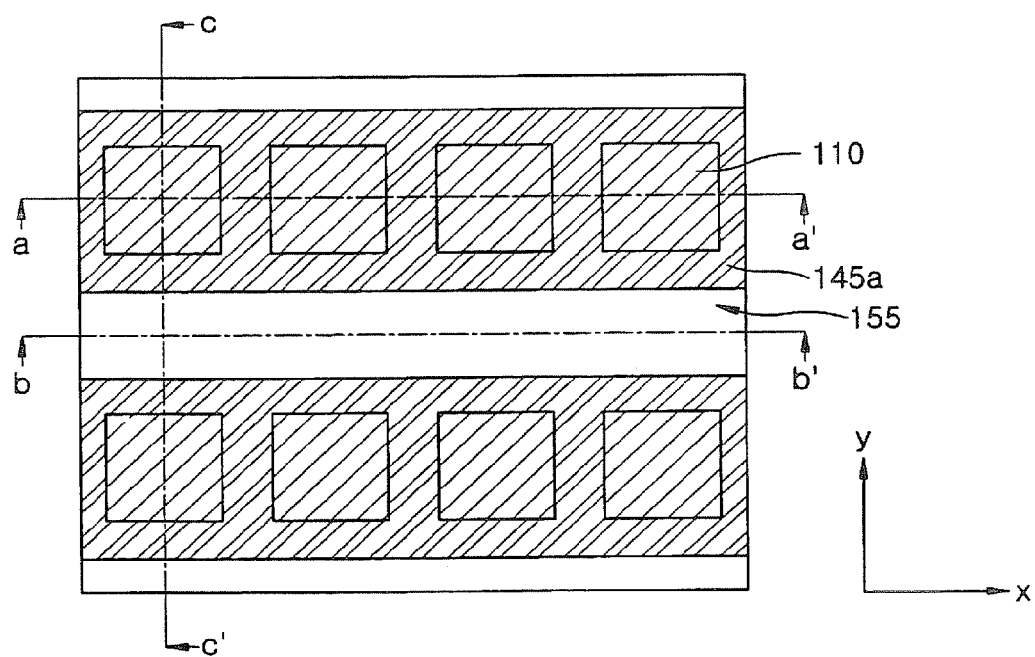
Figure 2C:
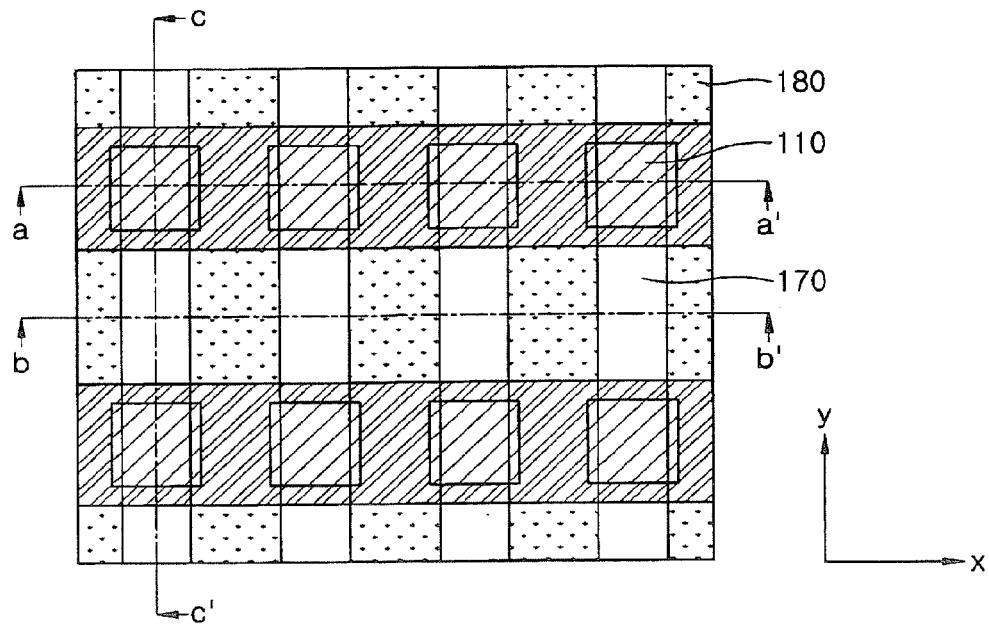
Figure 2D:
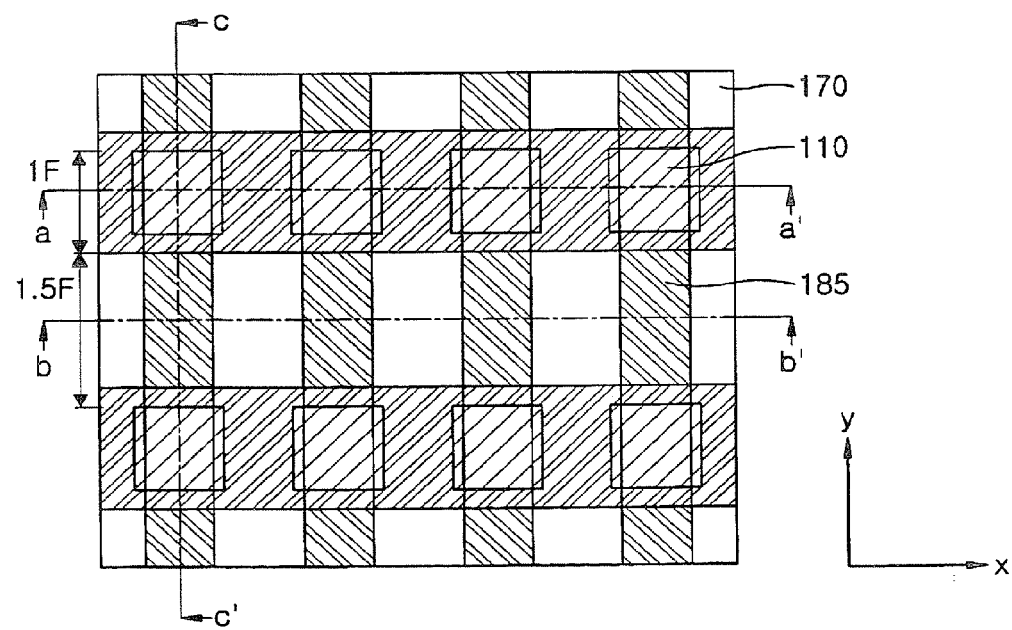

The word lines 185 in the illustrated embodiments extend along the y-axis as shown in FIG. 2D and are substantially orthogonal to the bit lines 145a extending along the x-axis. The word lines 185 may be electrically connected to the surrounding gate electrodes 120a via the conductive spacers 165.

Figure 3M:
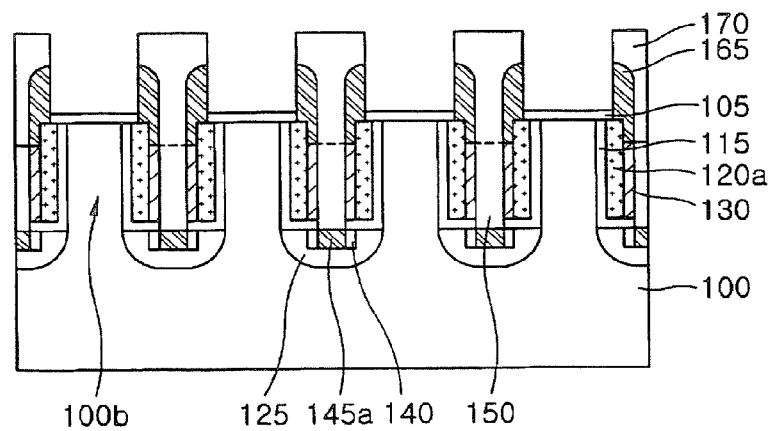
Figure 3N:
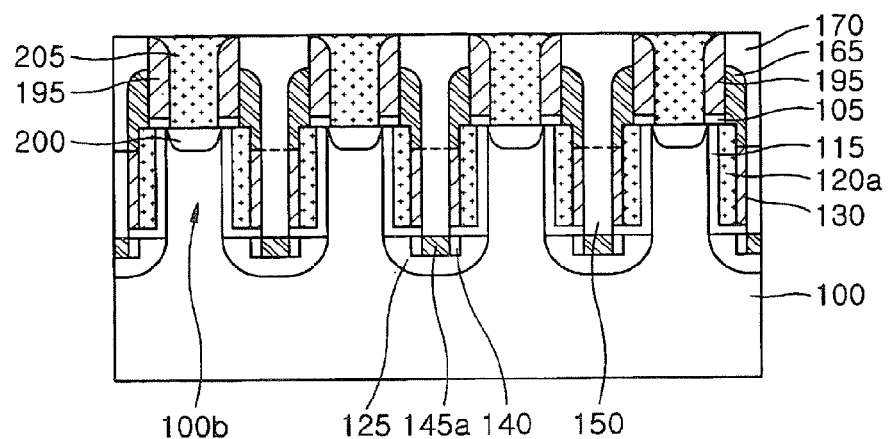
Figure 30:
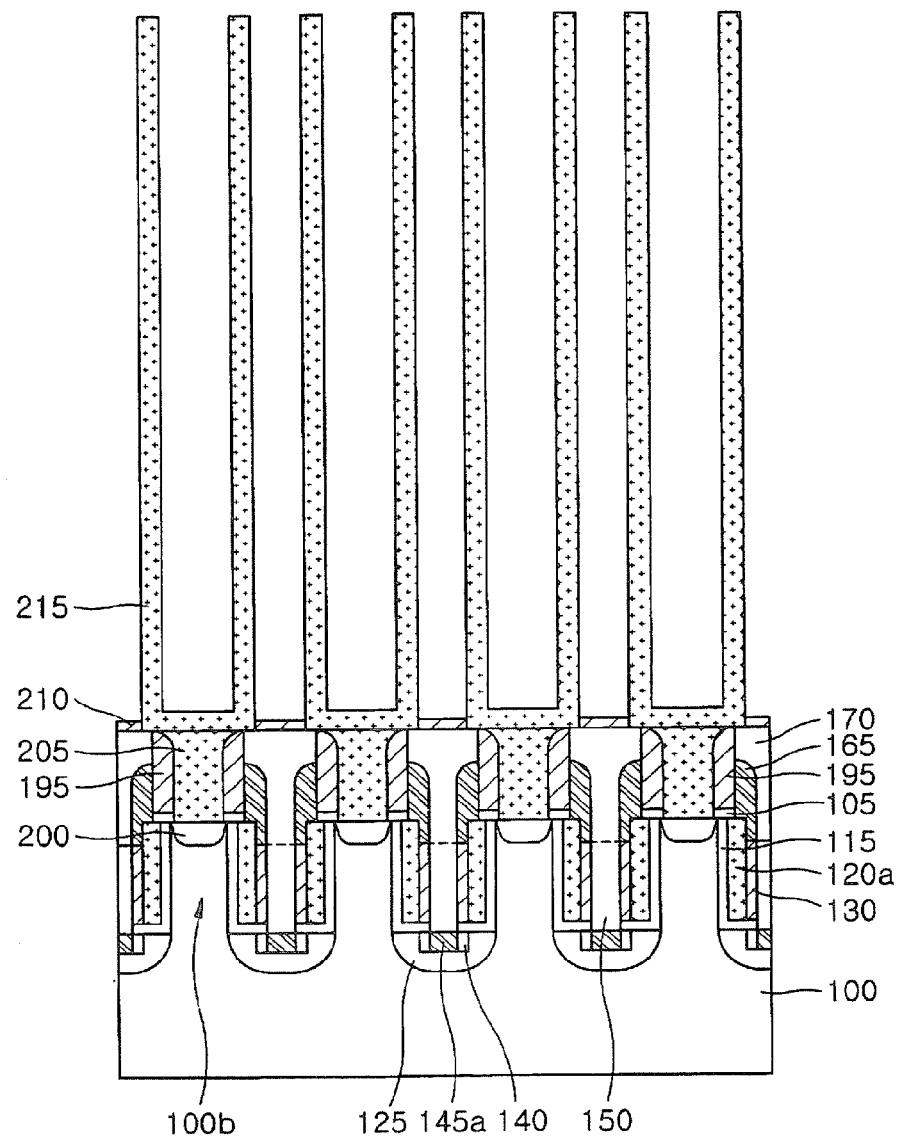
Figure 4L:
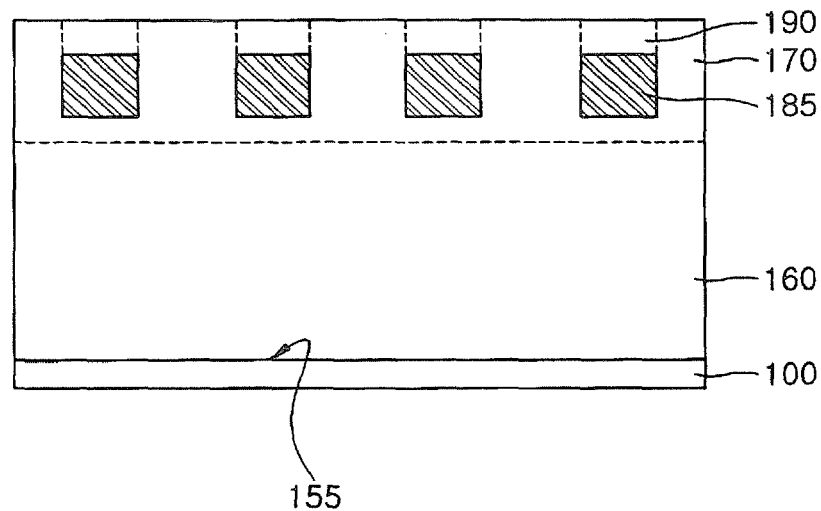
Figure 4M:
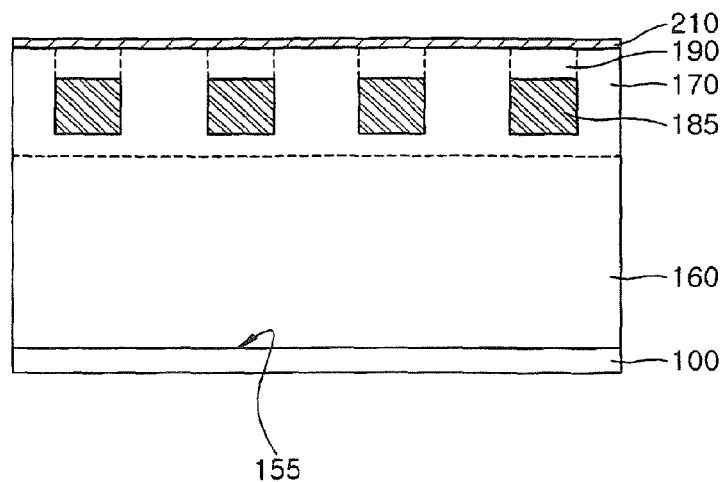
Figure 5N:
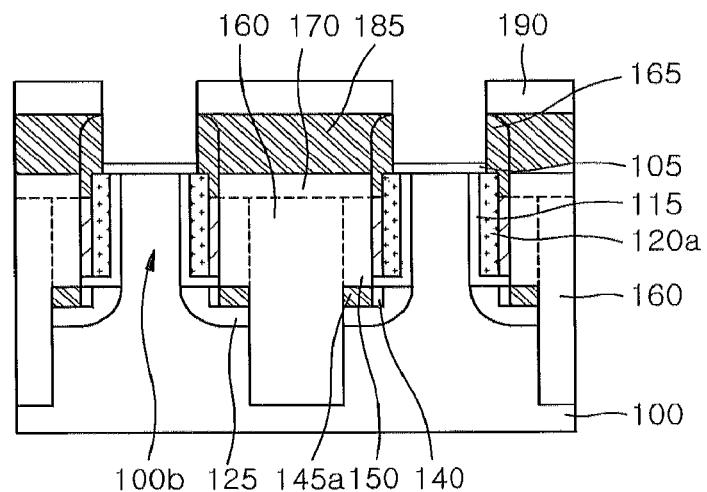
Figure 5O:
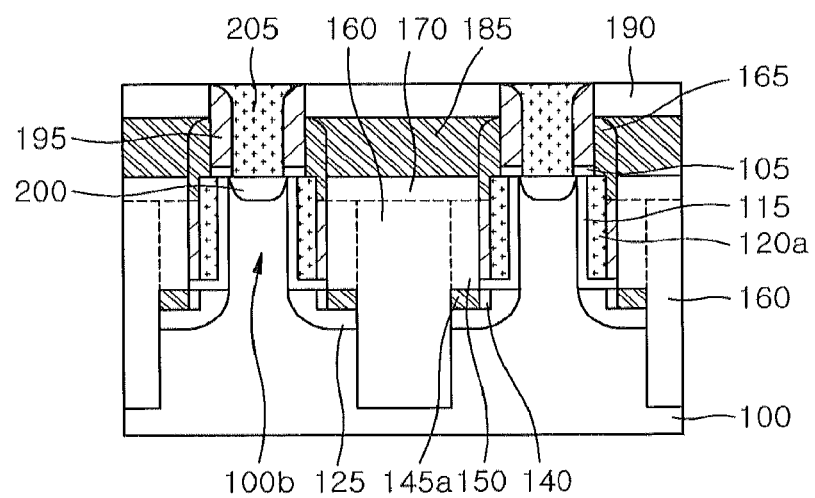
Figure 5P:
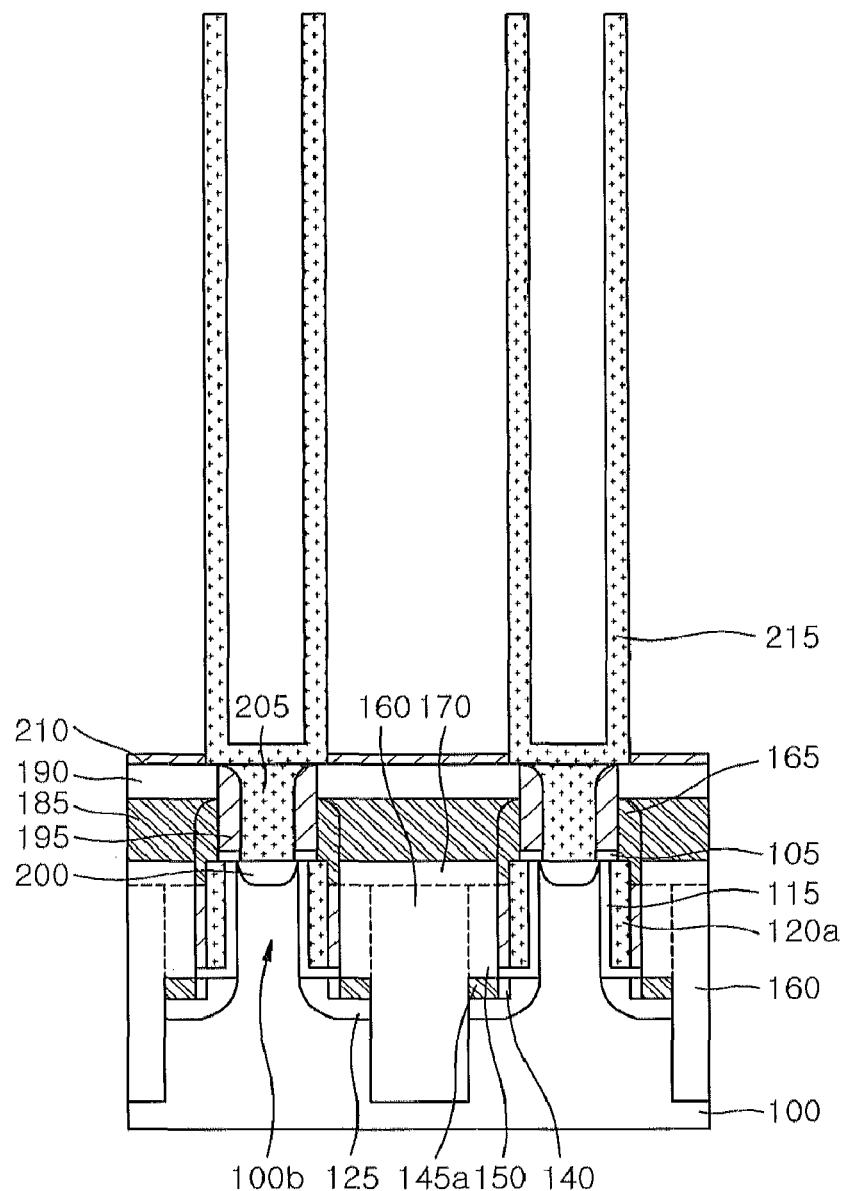

Referring now to the embodiments of FIGS. 3M, 4L, and 5N, an eighth dielectric film 190 is deposited, for example, to a thickness of about 1,000 to 2,000 Å on the resultant semiconductor substrate structure on which the word lines 185 are formed. The eight dielectric film 190 may be a silicon oxide film, like the fifth through seventh dielectric films 160,170, and 175. The eighth dielectric film 190 may be planarized so that the hard mask patterns 110 are exposed. At this time, as the heights of the word lines 185 are lower than those of the hard mask patterns 110, the word lines 185 are isolated by the fifth through seventh dielectric films 160, 170, and 175 even when the eighth dielectric film 190 is planarized. Then, the hard mask patterns 110 may be removed by a conventional method. As a result, the pad oxide film 105 on the pillars 100b may be exposed.

Next, referring to the embodiments of FIGS. 1G, 3N, 4M, and 5O, dielectric spacers 195 are formed. The dielectric spacers 195 may be formed by depositing a ninth dielectric film, having etching selectivity with respect to the semiconductor substrate 100 and the pad oxide film 105, on the resultant semiconductor substrate structure. For example, the ninth dielectric film may be a silicon nitride film and may be formed to a thickness of about 100 to 300 Å. The ninth dielectric film may be etched back so that a surface of the resultant semiconductor substrate structure, including a surface of the sixth dielectric film 170, is exposed to form the dielectric spacers 195 surrounding exposed sidewalls of the conductive spacers 165. The dielectric spacers 195 may serve to electrically insulate the conductive spacers 165 and subsequently formed contact pads.

An exposed portion of the pad oxide film 105 is etched using the dielectric spacers 195 as etching masks to expose surfaces of the pillars 100b. Impurities, for example, phosphorus (P) and/or arsenic (As), may be ionically implanted into the exposed surfaces of the pillars 100b to form source (and/or drain) regions 200. As a result, vertical channel MOS transistors are formed including the gate electrodes 120a formed on sidewalls of the pillars 100b, the source regions 200 formed in upper portions of the pillars 100b, and the drain regions 125 formed between the pillars 100b. In these vertical channel MOS transistors, the source regions 200 and the drain regions 125 are respectively disposed in upper and lower sides, and the gate electrodes 120a are disposed perpendicularly to a surface of the semiconductor substrate 100, thereby forming vertical channels with respect to a surface of the semiconductor substrate 100. Therefore, in some embodiments of the present invention, the vertical channel MOS transistors can have a sufficient channel length and occupy much smaller areas of the semiconductor substrate 100, relative to planar MOS transistors.

Storage node contact pads 205 may then be formed. A fifth conductive film may be deposited so that spaces between the dielectric spacers 195 are sufficiently filled. The fifth conductive film may be a polysilicon film containing an n-type impurity and may be formed to a thickness of about 500 to 1,500 Å. The fifth conductive film may be planarized so that surfaces of the dielectric spacers 195 are exposed, thereby forming the storage node contact pads 205 contacting with the source regions 200. As the storage node contact pads 205 for such embodiments may be formed in a self-aligned manner in the spaces for the hard mask patterns 110, unlike DRAM devices with conventional planar MOS transistors, no separate mask patterns for defining the storage node contact pads 205 are required in some embodiments of the present invention.

Referring now to the embodiments of FIGS. 1H, 3O, 4M, and 5P, an etch stopper 210 is deposited on exposed portions of the storage node contact pads 205, the sixth dielectric film 170, and the eighth dielectric film 190. For example, the etch stopper 210 may be a silicon nitride film and deposited to a thickness of 100 to 5000 Å. A mold oxide film may be deposited to a thickness of about 10,000 to 30,000 Å on the etch stopper 210. The mold oxide film and the etch stopper 210 may be etched so that the storage node contact pads 205 are exposed, to thereby define storage regions (not shown).

Storage node electrodes 215 may be formed. In particular, a sixth conductive film may be deposited on the mold oxide film and the storage regions. For example, the sixth conductive film may be a polysilicon film doped with an n-type impurity and/or a metal film such as a titanium film, a nickel film, a titanium nitride film, and/or a ruthenium film. The sixth conductive film may be formed to a thickness of about 100 to 500 Å. A sacrificing film may be formed on the sixth conductive film and then the sacrificing film and the sixth conductive film may be chemically and/or mechanically polished so that a surface of the mold oxide film is exposed, to thereby form the storage node electrodes 215. The mold oxide film and the sacrificing film may then be removed as illustrated in the figures.

Figure 1H:
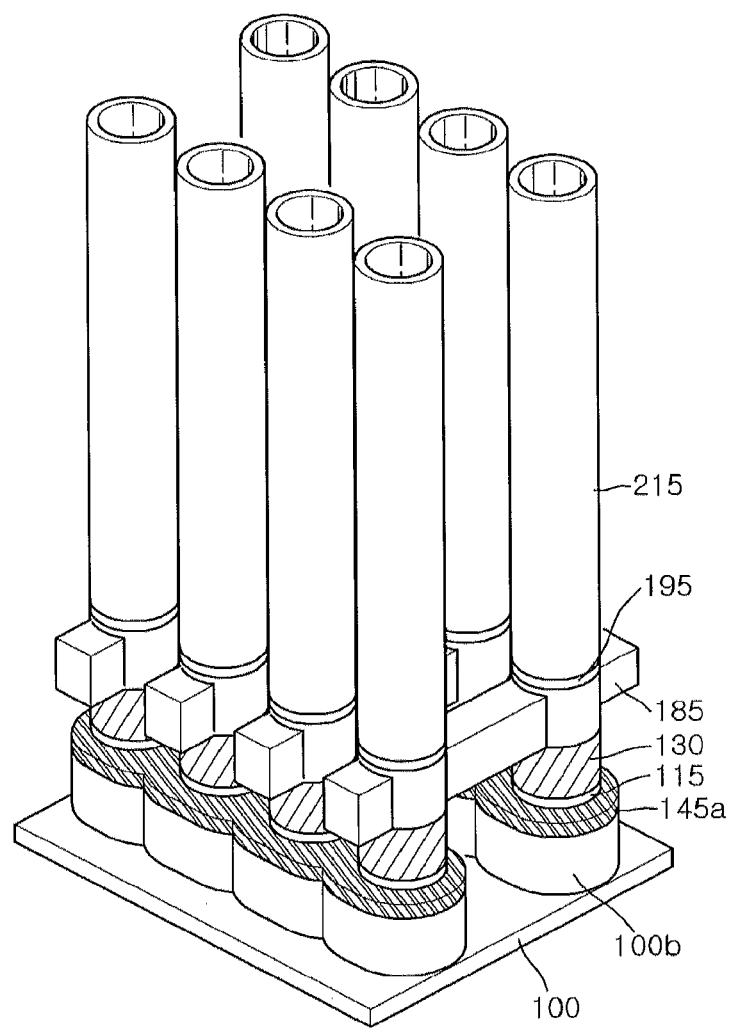

In semiconductor memory devices with the above-described vertical channel MOS transistors, as shown in FIGS. 1H and 2D, the gate electrodes 120a may be formed on outer surfaces of the pillars 100b, and the source regions 200 and the drain regions 125 may be, respectively, formed on upper and lower sides with respect to the gate electrodes 120a. As such, an area (C) occupying one MOS transistor may be $3.75F^2$ ($2.5F \times 1.5F$), provided that the linewidth of each hard mask pattern 110 is F. Therefore, an area of a MOS transistor according to some embodiments of the present invention can be reduced to less than ½ of the area (8F²) of a typical conventional planar MOS transistor.

In vertical channel MOS transistors according to some embodiments of the present invention, channels are formed perpendicularly to a substrate surface. Therefore, a channel length can be increased for a given substrate area, which may reduce or even prevent a short channel effect.

Furthermore, in vertical channel MOS transistors according to some embodiments of the present invention, as the gate electrodes 120a are formed on outer surfaces of the pillars 100b, i.e., on outer surfaces of pillar-shaped active regions, a channel width may be more than π-fold larger than that of MOS transistors with line-shaped gate electrodes. As a result, on-current (operating current) of the vertical channel MOS transistors can be enhanced. Also, in vertical channel MOS transistors according to some embodiments of the present invention, the gate electrodes 120a, the bit lines 145, the source and drain regions 200 and 125, and the storage node contact pads 205 can be formed in a self-aligned manner by formation of the hard mask patterns 110. Therefore, there may be no need to perform repeatedly a photolithography process, which may simplify a manufacturing process for the devices.

As apparent from the above description, according to some embodiments of the present invention, vertical channel MOS transistors are manufactured in a self-aligned manner using hard mask patterns and pillars defined by the hard mask patterns. Channels of the MOS transistors may be formed in a substrate vertically with respect to a surface of the substrate. Therefore, a channel length can be increased regardless of a transistor area, which may reduce or prevent a short channel effect of the transistor.

Furthermore, as gate electrodes in some embodiments are formed on outer surfaces of the pillars, channel widths can be increased relative to those of conventional planar gate electrodes, which may enhance the on-current of MOS transistors.

In semiconductor memory devices according to some embodiments of the present invention, as storage node electrodes are formed on a surface of a semiconductor substrate, there may be no limitation on the height and surface area of the storage node electrodes. In vertical channel MOS transistors of some embodiments of the present invention, gate electrodes, bit lines, source and drain regions, and storage node contact pads can be formed in a self-aligned manner by hard mask patterns without masking. Therefore, the number of photolithography processes can be reduced relative to planar MOS transistors requiring numerous mask patterns, thereby potentially simplifying a manufacturing process.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein

What is claimed is:

1. A semiconductor memory device of comprising:
a semiconductor substrate including a plurality of pillars separated from each other by a predetermined distance;
a device isolation film between the pillars;
respective surrounding gate electrodes electrically insulated from the pillars and surrounding an upper outside of each pillar;
first source/drain regions formed in an upper portion of respective ones of the pillar;
a second source/drain region formed in the semiconductor substrate between adjacent ones of the pillars;
a buried bit line, interposed between the second source/drain region and the device isolation film, electrically contacting the second source/drain region;
a word line formed in a cross-wise pattern with the bit line and electrically connected to ones of the surrounding gate electrodes;
contact pads, formed on respective ones of the first source/drain regions and contacting the respective ones of the first source/drain regions;
storage node electrodes formed on the contact pads; and
conductive spacers between an upper outside of the surrounding gate electrodes and the word line.

2. The semiconductor memory device of claim 1, wherein a conductive film for the conductive spacers and the word line is a transition metal film formed of tungsten (W), cobalt (Co), nickel (Ni), and/or titanium (Ti); a transition metal silicide film formed of tungsten silicide ($WSi_x$), cobalt silicide ($CoSi_x$), nickel silicide ($NiSi_x$), and/or titanium silicide ($TiSi_x$); and/or a tungsten nitride film (WN)/tungsten film (W).

3. The semiconductor memory device of claim 1, wherein the bit line surrounds a lower outside of respective ones of the pillars.

4. The semiconductor memory device of claim 1, wherein the bit line is a transition metal silicide film.

5. A semiconductor memory device comprising:
a semiconductor substrate;
a plurality of semiconductor material pillars in a spaced relationship on the semiconductor substrate;
respective surrounding gate electrodes surrounding ones of the pillars;
a first source/drain region in the semiconductor substrate between adjacent ones of the pillars;
a second source/drain region in an upper portion of at least one of the adjacent pillars;
a buried bit line in the first source/drain region and electrically coupled to the first source/drain region;
a storage node electrode on the upper portion of the at least one of the adjacent pillars and electrically contacting with the second source/drain region;
a word line contacting with ones of the surrounding gate electrodes and extending in a cross-wise pattern relative to the bit line; and
respective conductive spacers between the word line and the ones of the surrounding gate electrodes contacting the word line.

6. The semiconductor memory device of claim 5, wherein the conductive spacers are on an upper outside surface of the surrounding gate electrodes.

7. The semiconductor memory device of claim 5, wherein a conductive film for the conductive spacers and the word line comprises a transition metal film of tungsten (W), cobalt (Co), nickel (Ni), and/or titanium (Ti); a transition metal silicide film of tungsten silicide ($WSi_x$), cobalt silicide ($CoSi_x$), nickel silicide ($NiSi_x$), and/or titanium silicide ($TiSi_x$); and/or a tungsten nitride film (WN)/tungsten film (W).

8. The semiconductor memory device of claim 5, wherein the first and second source/drain regions are electrically insulated from the surrounding gate electrodes.

9. The semiconductor memory device of claim 5, wherein a dielectric material is located between adjacent ones of the pillars to electrically insulate the adjacent ones of the pillars.

10. The semiconductor memory device of claim 5, wherein the bit line is a transition metal silicide film.

11. The semiconductor memory device of claim 5 wherein:
the plurality of pillars are formed in a matrix and are separated from each other by a predetermined distance;
the first source/drain region is a drain region of a vertical channel transistor; and
the second source/drain region is a source region of the vertical channel transistor.

* * * * *